United States Patent [19]

Kase et al.

[11] Patent Number: 5,145,794
[45] Date of Patent: Sep. 8, 1992

[54] FORMATION OF SHALLOW JUNCTION BY IMPLANTATION OF DOPANT INTO PARTIALLY CRYSTALLINE DISORDERED REGION

[75] Inventors: Masataka Kase, Kawasaki; Nami Kimura, Yokohama; Yoshio Kikuchi, Yashio, all of Japan

[73] Assignee: Fujitsu Limited, Kawasaki, Japan

[21] Appl. No.: 578,117

[22] Filed: Sep. 6, 1990

[30] Foreign Application Priority Data

Sep. 8, 1989 [JP] Japan .................................. 1-231710
Jun. 19, 1990 [JP] Japan .................................. 2-158779

[51] Int. Cl.$^5$ .......................................... H01L 21/265
[52] U.S. Cl. .................................. 437/24; 437/950; 437/27
[58] Field of Search ........................ 437/24, 950; 148/DIG. 144

[56] References Cited

U.S. PATENT DOCUMENTS

4,889,819 12/1989 Davari et al. ...................... 437/950

FOREIGN PATENT DOCUMENTS

WO85/00694 2/1985 Int'l Pat. Institute .

OTHER PUBLICATIONS

"Optimization of the Germanium Preamorphization Conditions for Shallow-Junction Formation", Ozturk et al., IEEE Transactions on Electron Devices, vol. 35, No. 5, May, 1988, pp. 659–668.

"Novel Crystalline to Amorphous Transformation in Low Temperature Annealed Ge+ Implanted Si: Implications for Defect-Free Regrowth", Myers et al., Extended Abstracts, vol. 86-1, No. 1, May, 1986, pp. 255–256.

"Very Shallow p+-Junction Formation by Low-Energy BF$_2$+ Ion Implantation into Crystalline and Germanium Preamorphized Silicon", Ozturk et al., Applied Physics Letters, vol. 52, No. 12, Mar. 21, 1988, pp. 963–965.

"Optimization of Germanium Preamorphization Implant of Shallow p+ Junctions", Liu et al., Extended Abstracts, vol. 86-1, No. 1, May, 1986, pp. 347–348.

"Elimination of End-of-Range and Mask Edge Lateral Damage in Ge+ Preamorphized, B+ Implanted Si", Ajmera et al., Applied Physics Letters, vol. 49, No. 19, Nov., 1986, pp. 1269–1271.

"Optimization of the Amorphous Layer Thickness and the Junction Depth on the Preamorphization Method for Shallow-Junction Formation", Tanaka et al., Japanese Journal of Applied Physics, Aug. 28–30, 1989, 1st Conference, pp. 173–176.

"Recrystallization of Implanted Amorphous Silicon Layers. I. Electrical Properties of Silicon Implanted with BF$_2$+ or Si+ +B+$^{a)}$", Tsai et al., Journal of Applied Physics, vol. 50, No. 1, Jan., 1979, pp. 183–187.

"Eliminating Channeling Tail by Lower Dose Preimplantation", Kase et al., Applied Physics Letters, vol. 56, No. 13, Mar. 26, 1990, pp. 1231–1232.

(List continued on next page.)

Primary Examiner—Olik Chaudhuri
Assistant Examiner—Long Pham
Attorney, Agent, or Firm—Nikaido, Marmelstein, Murray & Oram

[57] ABSTRACT

A process for producing a semiconductor device, in which a predetermined electroconductive type ion is implanted into a semiconductor substrate, the process comprising the steps of: prior to the implantation of a predetermined electroconductive type ion, implanting an ion different from the electroconductive type ion into the semiconductor substrate having a crystalline structure, to form a disordered region having a degree of disorder such that microchanneling of the later implanted electroconductive type ion does not substantially occur, and that the disordered region is partially crystalline; and implanting the predetermined electroconductive type ion into the disordered region.

29 Claims, 19 Drawing Sheets

OTHER PUBLICATIONS

"Shallow p+ Junction Formation by a Reverse-Type Dopant Preamorphization Scheme", by Ganin et al., Appl. Phys. Lett. 54(21), 22 May 1989, pp. 2127–2129.

"Defect Production in Si(100) by $^{19}$F, $^{28}$Si, $^{40}$Ar, and $^{131}$Xe Implantation at Room Temperature", by Bai et al., J. Appl. Phys. 70(7), 1 Oct. 1991; pp. 3551–3555.

"B Diffusion in Si Predamages with Si+ Near the Threshold Dose of Amoriphization", by Kase et al., Appl. Phys. Lett. 59(11), 9 Sep. 1991, pp. 1335–1337.

M. Horiuchi, M. Tamura, and S. Aoki, "Three-dimensional solid-phase-epitaxial regrowth from As+-implanted Si", J. Appl. Phys. 65(6) 2238 (1989).

E. Landi and S. Solmi, "Electrical characteristics of p+/shallow junctions obtained by boron implantation into preamorphized silicon", Solid-State Electronics 29(11) 1181 (1986).

D-S. Wen, S. H. Goodwin-Johansson, and C. M. Osburn, "Tunneling Leakage in Ge-Preamorphized Shallow Junctions", IEEE Tran. on Electron Devices 35(7), 1107 (1988).

T. O. Sedgwick, A. E. Michel, V. R. Deline, S. A. Cohen, and J. B. Lasky, "Transient boron diffusion in ion-implanted crystalline and amorphous silicon", J. Appl. Phys. 63(5) 1452 (1988).

M. C. Ozturk, J. J. Wortman, and R. B. Fair, "Very shallow p+-n junction formation by low-energy $BF_2^+$ ion implantation into crystalline and germanium preamorphized silicon", Appl. Phys. Lett. 52(12) 963 (1988).

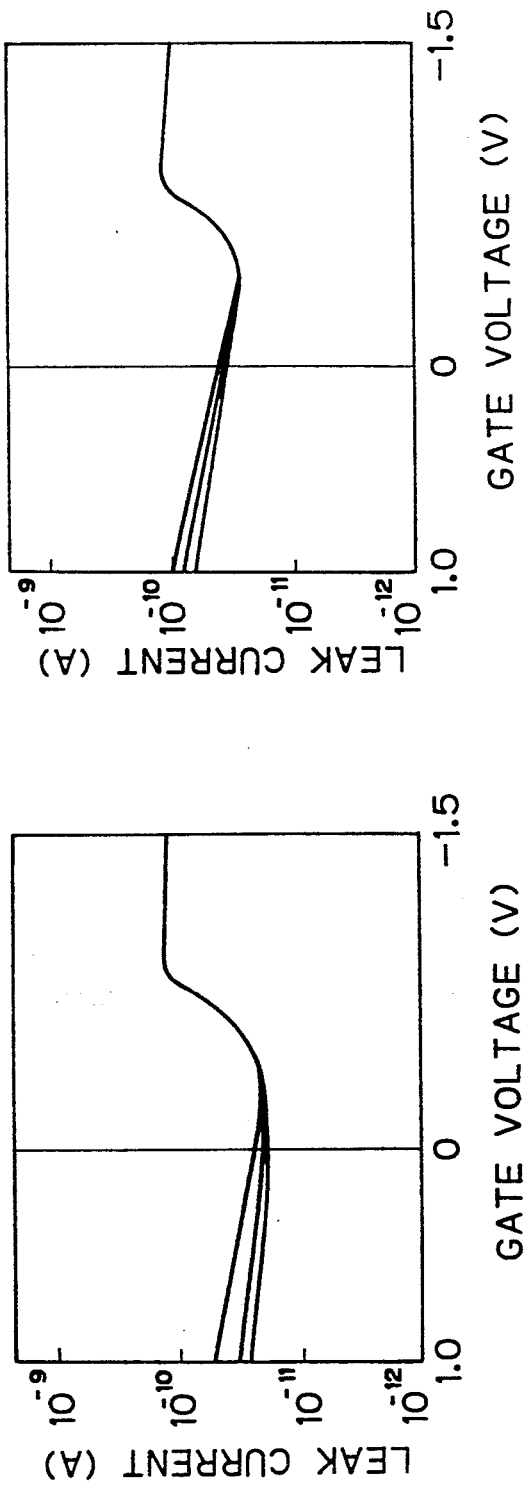

FORMATION OF SHALLOW JUNCTION BY IMPLANTATION OF DOPANT INTO PARTIALLY CRYSTALLINE DISORDERED REGION

BACKGROUND OF THE INVENTION

1. Field of the Invention

The present invention relates to a process for producing a semiconductor device, and particularly, to a process in which a shallow junction is formed by ion implantation.

2. Description of the Related Art

The integration of MOS-structured Si semiconductor devices has progressed to an extent such that the MOS transistor gate has a submicron length, and accordingly, the impurity diffused layers for the source and drain of a transistor must have a depth of less than 0.2 $\mu$m (200 nm). There is also an increasing demand for a highly integrated, high speed bipolar Si semiconductor device, and it has been suggested that the use of a shallow base diffused layer will effectively enable such a high speed bipolar device to be realized.

Ion implantation is widely used as an impurity introducing method, due to the outstanding high controllability and applicability thereof for general use, and will be found useful as a process step of forming of the above-mentioned impurity diffused layer. Namely, an ion implantation process is important to the forming of a shallow diffused layer.

The conventional formation of a shallow diffused layer by ion implantation is usually carried out in one of the following two ways:

(a) the energy used for the impurity ion implantation is reduced, or (b) prior to the implantation of impurity ions, the surface layer of a semiconductor substrate is made amorphous or amorphized by an implantation of silicon ions ($Si^+$), germanium ions ($Ge^+$), etc., to suppress a microchanneling of the later implanted impurity ions.

In method (a), the reduction of the implantation energy necessarily involves a reduction of the ion beam quantity. Particularly, when the implantation energy is reduced to 10 keV or less, a practically required beam current cannot be obtained. Therefore, the applicability of method (a) is limited.

Method (b)—hereinafter referred to as "ion preimplantation"—can provide a shallow impurity diffused layer without the reduction of the energy used for implanting the impurity ions. The ions to be preimplanted for the amorphization may be essentially any ions in principle, and in practice ions of the elements from groups III, IV, and V in the periodic table are considered most suitable for this purpose, from the viewpoint of coherency with the crystal lattice of silicon substrate. Among these elements, the group IV elements raise no problems, in that they are not electrically activated during a heat treatment as in the case of the elements of groups III or V, and further, have an advantage in that they have a good coherency with impurity elements to be later implanted. Si and Ge are particularly suitable as ions for the amorphization because they form a solid solution with the substrate Si in any proportion. In comparison with Si, Ge has a greater mass and is therefore considered to require a smaller dose for effecting the amorphization.

Many studies have been carried out on the amorphization for this purpose, as follows.

M. Y. Tsai and B. G. Streerman, "Recrystallization of implanted amorphous silicon layer. I. Electrical properties of silicon implanted with $BF_2^+$ or $Si^+ + B^+$.", J. Appl. Phys. 50(1) 183(1979) state that an amorphous layer is formed by an $Si^+$ implantation at a high dose and $BF_2^+$ or $B^+$ is then implanted. This amorphization enables boron to be activated at 550° C.

A. C. Ajmera and G. A. Rozgonyi, "Elimination of end-of-range and mask edge lateral damage in $Ge^+$ preamorphized, $B^+$ implanted Si.", Appl. Phys. Lett. 49(19)1269(1986) state that, when $Ge^+$ is implanted to amorphize a silicon substrate and $B^+$ is then implanted, the channeling tail of B is eliminated and the defects on the amorphous/crystal interface are not induced, although such defects are induced in the case of an $Si^+$ implantation. Although this suggests a recovery of defects by an RTA (rapid thermal annealing) at 1050° C. for 10 sec, it does not contain a clear comparison of the boron distribution with and without a $Ge^+$ ion implantation after RTA.

M. Horiuchi, M. Tamura, and S. Aoki, "Three-dimensional solid-phase-epitaxial regrowth from $As^+$-implanted Si." J. Appl. Phys. 65(6)2238(1989) describe the crystal defects which are induced during the growth of an amorphous layer formed by an $As^+$-implantation. The growth of crystal defects is more correctly explained by a mechanism in which a crystal orientation participates, rather than by a mechanism which depends on a stress due to a deposited film.

E. Landi and S. Solmi, "Electrical characteristics of $p^+/n$ shallow junctions obtained by boron implantation into preamorphized silicon.", Solid-State Electronics 29(11)1181(1986) estimated a leak current of a $p^+/n$ diode formed by using an amorphization effected by an $Si^+$ ion implantation. No leak current is observed when the depletion layer does not contain a dislocation loop generated as a defect on the amorphous/crystal interface. Diffusion is controlled by the annealing temperature to determine a condition for obtaining a low leak current.

D-S. Wen, S. H. Goodwin-Johansson, and C. M. Qsburn, "Tunneling Leakage in Preamorphized Shallow Junctions." IEEE Trans. on Electron Devices 35(7)1107(1988) state that a $Ge^+$ implanted layer is estimated by using a gate-controlled type diode made by a $Ge^+$ amorphization. This estimate was not successful because the concentration of impurities (B, As) in the diode region was high, and therefore, a tunneling current due to a high electric field was greater than a leak current due to a crystal defect.

T. O. Sedgwick, A. E. Michel, V. R. Deline, S. A. Cohen, and J. B. Lasky, "Transient boron diffusion in ion-implanted crystalline and amorphous silicon." J. Appl. Phys. 63(5)1452(1988) describe the influence of amorphization on the boron diffusion. Amorphization suppresses the boron diffusion when boron is distributed to a depth shallower than the amorphous/crystal interface, and boron has a high diffusion rate when an amorphization is not effected.

M. C. Ozturk, J. J. Wortman, and R. B. Fair, "Very shallow $p^+$-junction formation by low-energy $BF_2^+$ ion implantation into crystalline and germanium preamorphized silicon.", Appl. Phys. Lett. 52(12)963(1988) state that a shallow junction of about 100 nm is formed by a $Ge^+$ preamorphization and a $BF_2^+$ ion implantation followed by an RTA at a temperature of from 950° C. to 1050° C. The relationship between the sites at which fluorine precipitates and the position of crystal defect is also described.

Nevertheless, a problem remains in that, when the ion preimplantation is carried out at a dose required for an amorphization of the semiconductor surface, the defects induced thereby in the silicon crystal are not eliminated by a later annealing but are retained, and thus a good semiconductor characteristic cannot be obtained.

SUMMARY OF THE INVENTION

The object of the present invention is to provide a process for producing a semiconductor device, by which the retaining of the crystal defects induced by the ion preimplantation is prevented and the microchanneling of impurity elements is suppressed, to thereby enable a shallow junction to be formed.

Therefore, according to the present invention, there is provided a process for producing a semiconductor device, in which a predetermined electroconductive type ion is implanted into a semiconductor substrate, said process comprising the steps of:

prior to implantation of a predetermined electroconductive type ion, implanting an ion different from said electroconductive type ion into the semiconductor substrate having a crystalline structure to form a disordered region having a degree of disorder such that microchanneling of the later implanted electroconductive type ion does not substantially occur and that the disordered region is partially crystalline; and implanting said predetermined electroconductive type ion into said disordered region.

The ion different from the predetermined electroconductive type ion is preferably electrically inactive.

There is also provided a process for producing a semiconductor device, comprising the steps of:

prior to implantation of a predetermined impurity ion, forming in a semiconductor substrate having a crystalling structure a disordered region containing constituent elements of the semiconductor, which are not on the regular lattice sites of the crystalline structure, in a concentration such that microchanneling of the later implanted impurity does not substantially occur and that the disordered region is partially crystalline, and implanting said impurity ion into said disordered region.

More preferably, the disordered region is formed to a depth greater than that to which the predetermined electroconductive type ion or the impurity is to be implanted.

The degree of disorder is preferably such that the disordered region contains the constituent elements of the semiconductor, which are not on the regular lattice sites of the crystalline structure, in a concentration of more than 17% and less than 100%, mote preferably 30 to 50%.

When a silicon semiconductor substrate is used as the semiconductor substrate according to the present invention, the electroconductive type ion or the impurity ion is usually selected from the group consisting of phosphorus ion, arsenic ion, boron ion, antimony ion, and ions containing any of these elements, and is most general&y a boron ion or an ion containing boron.

The ion implantation prior to the implantation of an electroconductive type ion is successfully effected by an implantation of germanium ion (Ge+) at a dose of more than $2 \times 10^{13}$ cm$^{-2}$ into a silicon substrate, to form the disordered region.

The ion implantation prior to the implantation of an electroconductive type ion is also successfully effected by an implantation of silicon ion (Si+) at a dose of more than $5 \times 10^{13}$ cm$^{-2}$ into a silicon substrate, to form the disordered region.

After the implantation of the germanium ion or silicon ion is completed, an implantation of $BF_2^+$ ions is carried at an energy of 15 keV or less, or an implantation of boron ions is carried out at an energy of 3 keV or less.

After the implantation of an electroconductive type ion is completed, the semiconductor substrate is heat-treated at a temperature lower than 800° C. but preferably higher than 600° C.

The heat treatment is generally carried out for from 10 min to 2 hours.

The present invention forms a disordered region containing retained crystal fragments which have a lower continuity and do not cause a microchanneling of the implanted electroconductive type ion in the substrate, and which effectively function as a nucleus for a recrystallization of the disordered region.

BRIEF DESCRIPTION OF THE DRAWINGS

FIGS. 4a and 4b are graphs showing the relationship between the gate voltage and the leak current of a gate-controlled type p+n diode for the cases (a) in which amorphization is not effected and (b) in which amorphization is effected, respectively;

FIGS. 5a, 5b, 5c, and 5e are transmission electron micrographs, in which FIG. 5a shows a gate end damage in a silicon substrate amorphized by a high-energy implantation of Ge+, FIG. 5b the same region when annealed at 600° C., FIG. 5c the same region when annealed at 800° C., FIG. 5e a gate end damage in another silicon substrate which is not amorphized, and FIG. 5d schematically illustrates a recrystallization in three directions;

DESCRIPTION OF THE PREFERRED EMBODIMENTS

According to the present invention, the semiconductor surface is not fully amorphized as in the conventional process but is disordered so that parts of the constituent elements of semiconductor (Si in the case of an Si semiconductor) are not on the regular crystal lattice sites, to suppress the microchanneling phenomenon without the formation of serious crystal lattice defects.

The term "disorder" as used herein means that the constituent atoms of a semiconductor are not on the regular lattice sites.

For a region of a semiconductor crystal, the concentration of atoms which are not on the regular lattice sites is referred to as a "degree of disorder" for the region. The concentration of such "off-site" atoms can be expressed by the $\chi$ value (%), as will be discussed later. For a fully amorphized condition, the degree of disorder or the $\chi$ value is 100%.

In the conventional process using a full amorphization, a Ge+ ion dose of about $2 \times 10^{14}$ cm$^{-2}$ was used, and the degree of disorder obtained therethrough was mainly determined by a Rutherford backscattering spectroscopy, RBS. In the RBS, a light-weight ion such as He+ or alpha particle accelerated to a high energy of 2 MeV or so is injected to a solid object and the energy of He+ or alpha particle scattered a wide angle from the nucleus of the constituent atoms of the solid is analyzed to obtain information on the lattice sites of impurities contained in the solid, and the distribution of crystal defects, etc.

Figure 1:
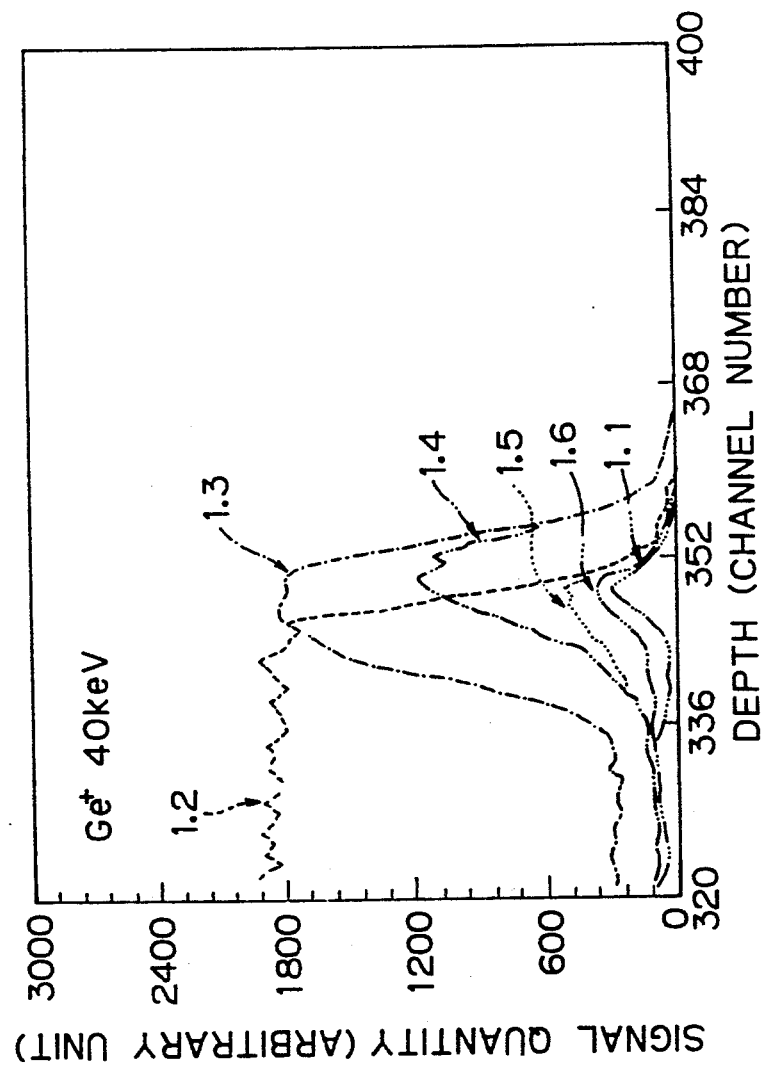
FIG. 1 is a graph showing data obtained by an RBS measurement of a silicon substrate implanted with Ge+ ion.

An example obtained by such a measurement is shown in FIG. 1, in which reference numerals 1.1 and 1.2 denote the results from a channeling measurement and a random measurement, respectively, for a silicon crystal before ion implantation and reference numerals 1.3 to 1.6 denote the results obtained when the Ge+ ion is implanted at an energy of 40 keV and under the following dose conditions.

Condition of Ion Implantation 1.1 Channeling measurement of silicon crystal (not ion-implanted)

1.2 Random measurement of silicon crystal (not ion-implanted)

1.3 Channeling measurement of a silicon sample to which the Ge+ ion was implanted at 40 keV with a dose of $2 \times 10^{14}$ cm$^{-2}$.

1.4 Channeling measurement of a silicon sample to which the Ge+ ion was implanted at 40 keV with a dose of $5 \times 10^{13}$ cm$^{-2}$.

1.5 Channeling measurement of a silicon sample to which the Ge+ ion was implanted at 40 keV with a dose of $2 \times 10^{13}$ cm$^{-2}$.

1.6 Channeling measurement of a silicon sample to which the Ge+ ion was implanted at 40 keV with a dose of $1 \times 10^{13}$ cm$^{-2}$.

In the above experiment, the ion implantation was carried out at room temperature for all samples. It is generally known that, at a higher implantation temperature, a less disorder of the silicon lattice is induced, and vice versa. At a lower implantation temperature, for example, at the liquid nitrogen temperature, the microchanneling is prevented with a lower dose.

A 2.275 MeV helium ion was used as the incident ion, and the energy of the scattered ion was measured at a position inclined at 105° to the incident beam. Since the surface layer of the sample 1.3 was substantially fully disordered by the Ge+ ion implantation, even when helium ions are introduced in the channeling direction, the signal from the helium ions impinged against the silicon atoms not on the regular lattice sites in the surface layer is measured in the same amount as that measured when helium ions are introduced in a random direction. A high speed helium ion has such a small nuclear scattering cross section that the RBS measures those ions which have been nuclear-scattered only once in a sample. The $\chi$ value is defined as the quotient of the signal height for the surface divided by the signal height from the random measurement. The conventional amorphization was carried out under a condition in which the $\chi$ value was 100%. Table 1 summarizes the $\chi$ value for the samples 1.1 to 1.6.

TABLE 1

| Sample | $\chi$ (%) |
|---|---|
| 1.1 | 1.9 |
| 1.2 | 100 |
| 1.3 | 100 |
| 1.4 | 45.2 |
| 1.5 | 17.0 |
| 1.6 | 8.4 |

These results show that the $\chi$ value is substantially proportional to the dose value until a full amorphization is achieved. This allows an estimation that the dose value for full amorphization is approximately $1.2 \times 10^{14}$. The distribution of $\chi$ value along the depth of the sample is taken into consideration in a more detailed discussion. The $\chi$ value is lowered when the implantation energy is lowered and is raised when the implantation energy is increased.

The present invention will be described in more detail by way of examples using a Si semiconductor.

EXAMPLE 1

Figure 2:
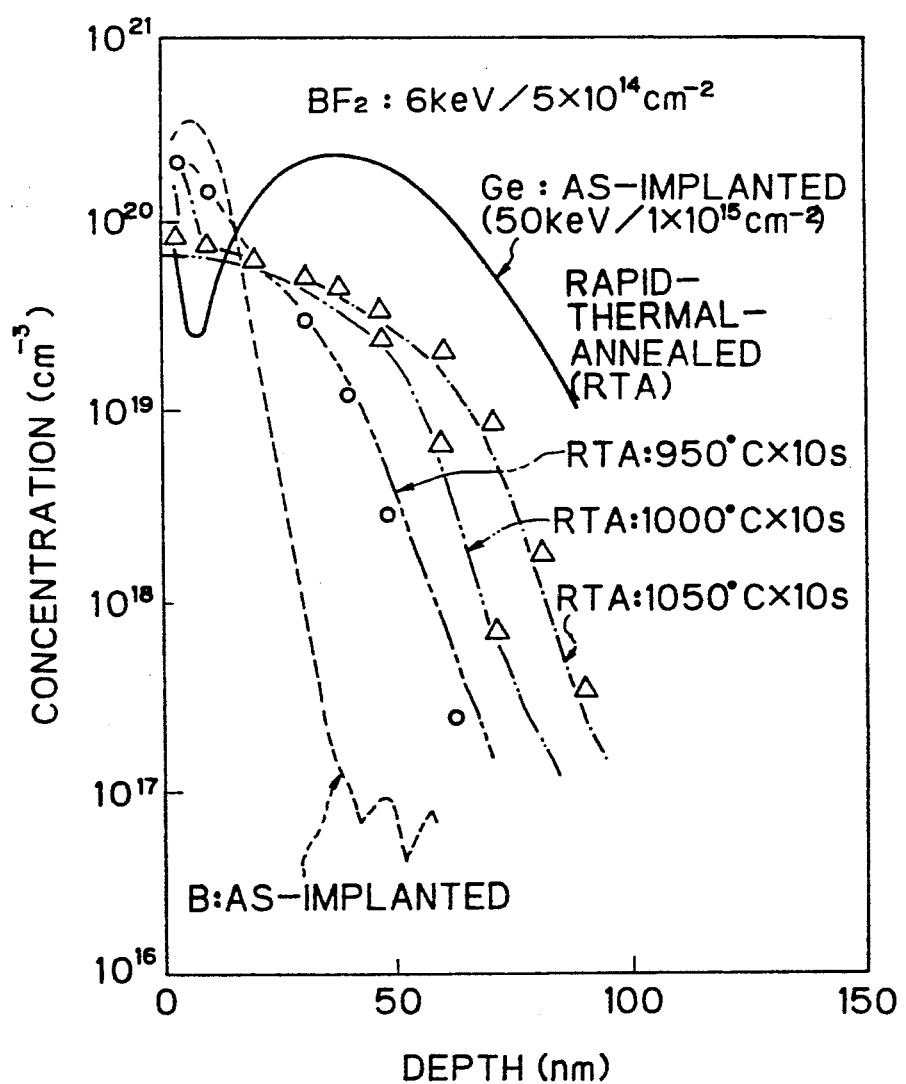
FIG. 2 is a graph showing the redistribution of boron after a high temperature annealing.

First, the influence of annealing is discussed. After ion implantations are completed, the implanted impurities are activated by annealing. The annealing is indispensable to recover crystal defects and ensure good semiconductor characteristics, but an excessive annealing, i.e., an annealing carried out at an excessively high temperature or long time, promotes the diffusion of impurities and makes it impossible to form a shallow junction. FIG. 2 shows a boron distribution caused by annealing after a Ge+ ion implantation and a BF$_2$+ ion implantation (M. C. Ozturk, J. J. Worttman and R. B. Fair, Appl. Phys. Lett., 52(12) 963(1988), in which an extensive diffusion occurred even at an annealing at 950° C. for 10 seconds. Therefore, annealing must be carried out at a lower temperature, to prevent the diffusion.

A low temperature annealing, however, involves a serious problem in that crystal defects induced by ion implantation are retained after annealing. A method has been proposed of estimating such crystal defects including the sites and amount thereof, in which a fast-diffusive ion, such as F+, is implanted and the segregated amount of the ion is measured after annealing. A large amount of the retained fast-diffusive element indicates that a large amount of crystal defects are retained, and when the fast-diffusive element is present only at a certain depth, crystal defects are locally concentrated at that depth. It is well known that the position of crystal defects is determined by an SIMS estimation of the distribution of F introduced by BF+ ion implantation (see M. C. Ozturk, J. J. Worttman and R. B. Fair, Appl. Phys. Lett., 52(12)963(1988), for example).

In the amorphization technology, the crystallinity after annealing is a vital issue and the positional relationship between the induced crystal defects and the p-n junction is also important. A usual ion implantation does not cause problems such as an increased leak current, because the impurity ions are diffused during the heat treatment for annealing, which leads to a separation of the p-n junction and the layer damaged by ion implantation. Nevertheless, an amorphization may cause an increase of the leak current, because the layer damaged by the amorphization ion implantation is relatively close to the p-n junction. The post-annealing crystallinity of an amorphized layer has been estimated by measuring the inverse current of a pn diode made in a simple circular or oblong form, and such an estimation has provided a value of 2 to $3 \times 10^{14}$ cm$^{-2}$ as an optimum dose of a Ge+ ion implantation for amorphization, to minimize the leak current.

In the case of a simple pn diode such as an n+p diode, however, the depletion layer is not substantially formed in the damaged layer induced by the amorphization ion implantation, because the n+ layer has a high concentration. This causes an improper estimation of the crystallinity of the damaged layer induced by the amorphization ion implantation.

Figure 3A:
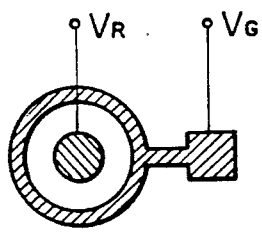
FIGS. 3a, 3b, and 3c are (a) a plan view schematically illustrating a gate-controlled type p+n diode, (b) a sectional view showing the relationship between the gate voltage and the depletion layer, and (c) a graph showing the relationship between the gate voltage and the leak current, respectively.
Figure 3B:
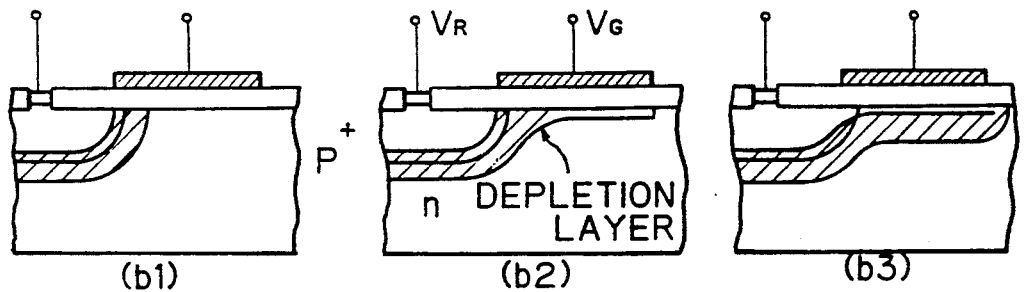
Figure 3C:
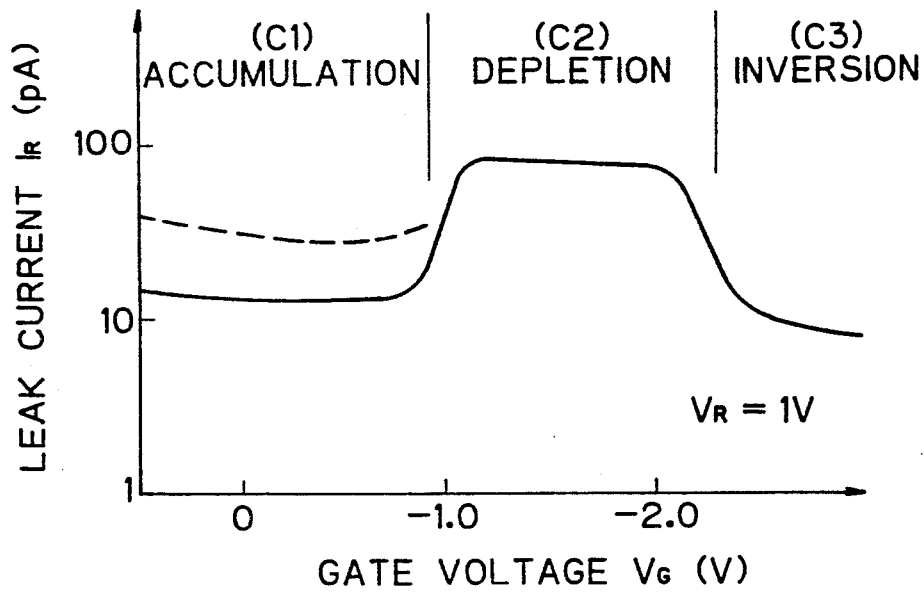

In the present invention, to eliminate the above drawback, a gate-controlled type p+n diode is employed to estimate the amorphized layer. FIG. 3a schematically illustrates, the arrangement of the diode used for this purpose. When the gate voltage V$_G$ is varied and the corresponding inverse current is measured as shown by FIGS. 3b(b1) to 3b(b3), together with the corresponding FIGS. 3c(c1) to 3c(c3), the depletion layer is intruded into the diffused layer on the accumulation side as shown in FIGS. 3b(b1) and 3c(c1), and therefore, the increase of leak current as shown by the dotted line in FIG. 3c indicates an increase of the crystal defects in the diffused layer, and in turn, an increase of the residual defects induced by ion implantation. The thus measured leak current and gate voltage have a relationship therebetween as shown by FIGS. 4a and 4b, from which it is seen that the conventional full amorphization at 40 keV with a dose of $2 \times 10^{14}$ cm$^{-2}$ (FIG. 4b) resulted in a leak current about three times great as that observed when amorphization was not effected (FIG. 4a).

A sectional analysis by a transmission electron microscope (TEM) is an effective means of estimating the crystallinity of a crystalline structure.

Figure 5A:
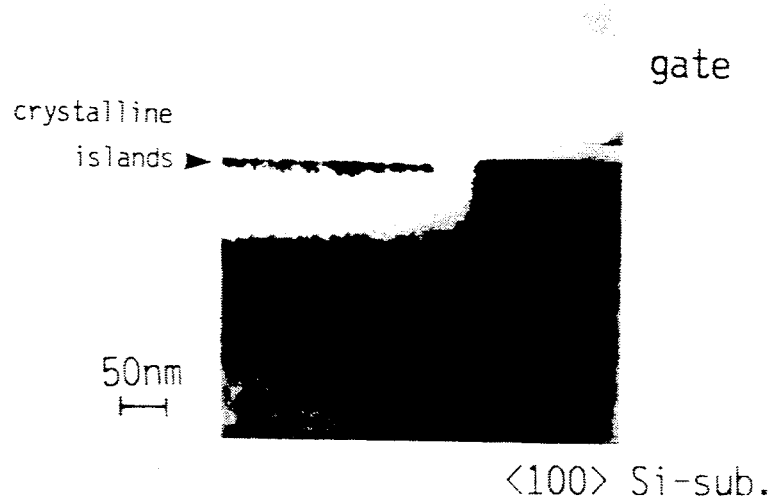

FIG. 5a is a cross sectional TEM photograph (XTEM) showing a gate end damage of an as-implanted silicon substrate implanted with Ge+ at 40 keV with a dose of $2 \times 10^{14}$ cm$^{-2}$. The light contrast portion is the amorphized region. A crystalline islands are retained in the substrate surface due to the high-energy implantation of Ge+.

Figure 5B:
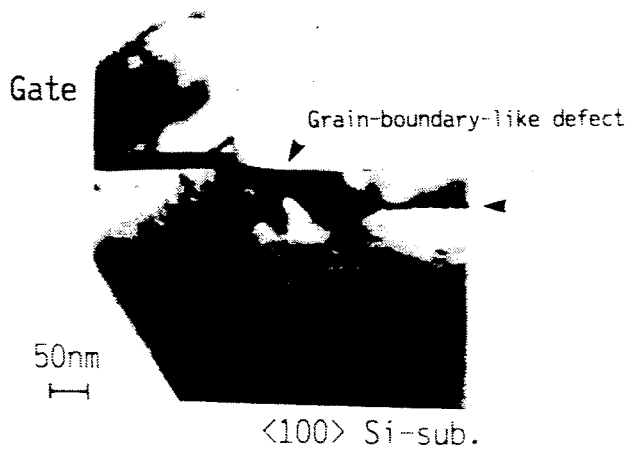

FIG. 5b is an XTEM showing the same sample after annealing at 600° C. for 30 min. The amorphous layer is eliminated by recrystallization, and the dark contrast portion is a defect like a grain boundary of a polycrystalline silicon, and is difficult to eliminate this defect by annealing.

Figure 5C:
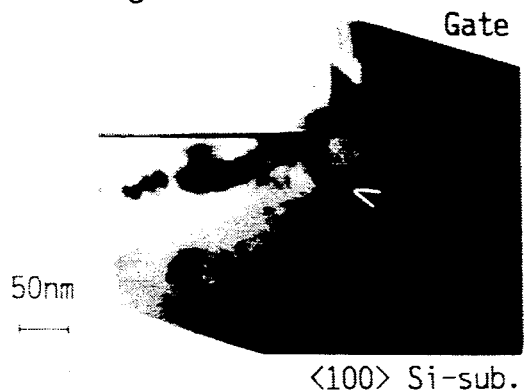

FIG. 5c is an XTEM showing the same sample after annealing at 800° C. for 30 min. Crystal defects are retained in the same form as that shown in FIG. 5b. Namely, the grain-boundary-like defect cannot be eliminated even by raising the annealing temperature to 800° C. Another crystal defect is also formed at a depth of about 120 nm, which corresponds to the depth of amorphous/crystal interface, indicating that this defect is an amorphous/crystal interface defect. The mechanism of the formation of these grain boundary-like defects is as follows. In the amorphous layer formed by ion implantation, the crystal growth rate is highest in the <100> direction. Therefore, in the case of an amorphous layer formed at the gate end, the solid phase crystal growth rate is highest in the following equivalent three directions; the upward direction from the substrate crystal, the downward direction from the retained crystal islands on the initial substrate surface, and the sideward direction from the gate end, as schematically illustrated in FIG. 5d. At sites on which these three types of solid phase crystal growths impinge, a lattice gap or dislocation is easily formed and the precipitation of impurities also easily occurs, and a combination of these phenomena causes the formation of a large crystal defect.

In the case of FIG. 5c, the crystalline islands retained at the initial surface of the silicon substrate act as a seed for a solid phase crystal growth, to cause the formation of a grain-boundary-like defect at a depth of about 50 nm, which can be avoided by reducing the Ge+ ion implantation energy, a higher dose, or a double implantation, etc. Nevertheless, the defect formed at the gate end cannot be avoided as long as amorphization is carried out.

Figure 5E:
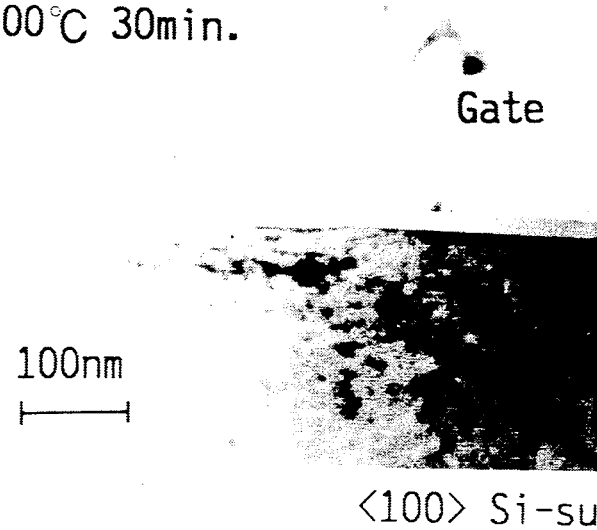
Figure 5D:
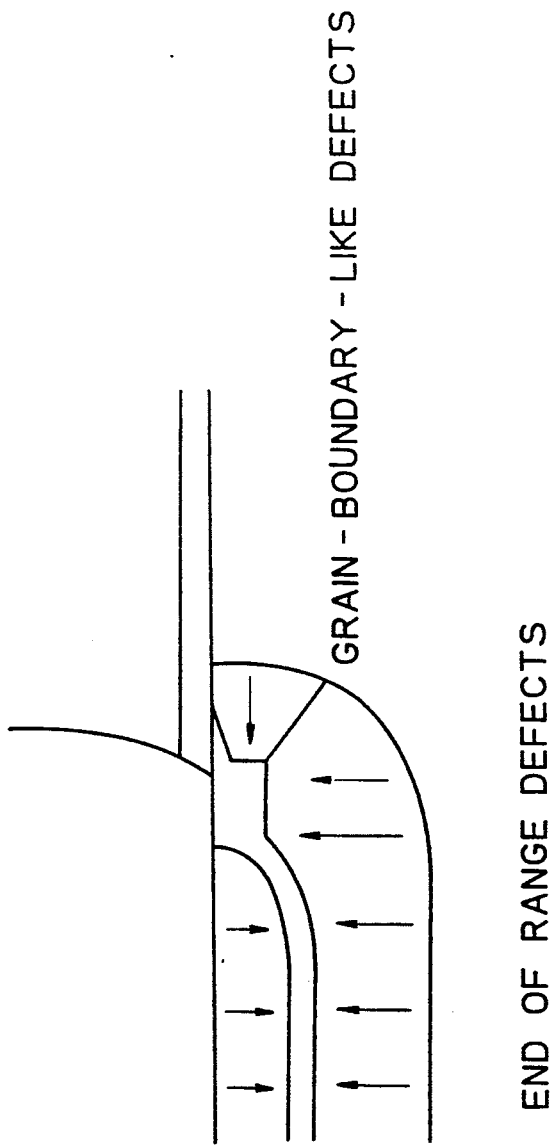

FIG. 5e is an XTEM showing a gate end, in which Ge+ ions were implanted at 40 keV with a dose of $5 \times 10^{13}$ cm$^{-2}$, to avoid amorphization, and annealing was carried out at 600° C. for 30 min. A large defect such as seen in FIG. 5b is not formed, although dark spots are scattered at a depth of about 30 to 50 nm, which corresponds to the mean projected range (Rp) of Ge+. This is mainly because the amorphization was not effected.

Even when a full amorphization is not effected, an amorphous region composed of from several tens to hundreds of atoms is formed in the as-implanted substrate by an impingement of a single Ge+ ion with the Si lattice, on a microscopic or atomic scale. Nevertheless, in a case in which the Ge+ dose is small, the amorphous regions do not fall on each other and a fully amorphized layer as shown in FIG. 5a is not formed, i.e., a macroscopic solid phase growth or the growth of a completely amorphized layer does not occur. It is seen from FIG. 5e that the solid phase growth of microscopic amorphous regions does not lead to the formation of a macroscopic crystal defect. Although both the macroscopic solid phase growth and the microscopic solid phase growth are caused by the same mechanism, nevertheless the differences in the precipitation of impurities, the size of the amorphous phase, the size of the defects, etc., cause the difference in the defects present after annealing. Therefore, the key to the prevention of the formation of macroscopic defects is to prevent the macroscopic solid phase growth. To this end, preferably an amorphization is not fully effected, but instead, the crystalline structure is partially retained in an implanted layer. The crystalline structure partially retained in an implanted layer prevents the macroscopic solid phase growth.

Figure 6B:
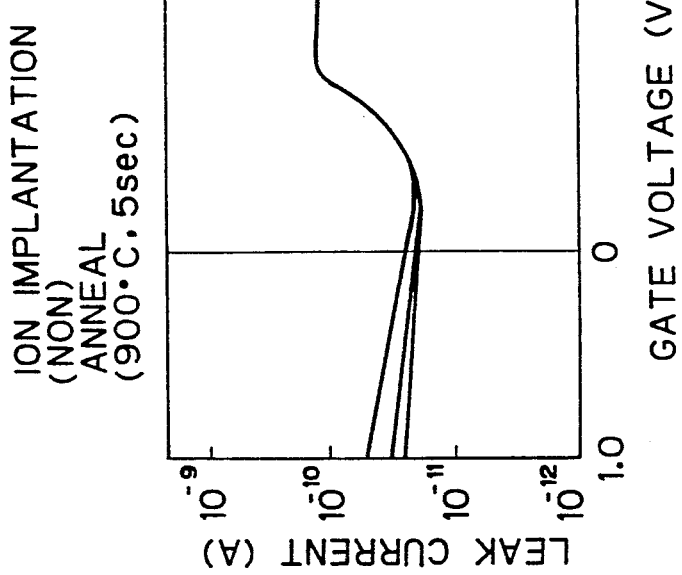
FIGS. 6a and 6b are graphs showing the relationship between the gate voltage and the leak current of a gate-controlled type p+n diode for the cases (a) in which a Ge+ ion implantation was carried out according to the present invention and (b) in which a Ge+ ion implantation was not carried out.
Figure 6A:
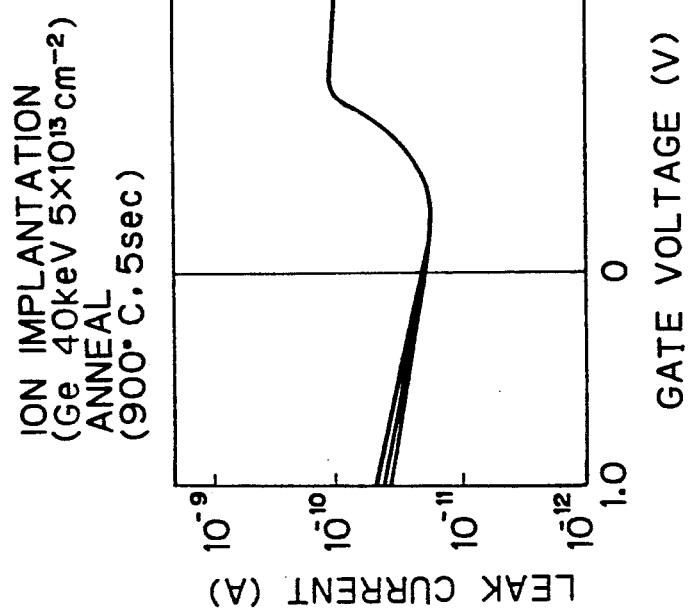

To reduce the amount of the retained crystal defects, and in turn, the leak current, it is effective to use a smaller dose in the Ge+ ion implantation. FIG. 6a shows the characteristic of a gate-controlled type diode produced by using a smaller dose of $5 \times 10^{13}$ cm$^{-2}$ in the Ge+ ion implantation. The same characteristic was observed as that shown in FIG. 6b (recited from FIG. 4a) in which amorphization was not effected and no increase of the leak current was observed. Namely, the crystal defects induced by ion implantation were eliminated.

Under such a small dose or a dose insufficient for full amorphization, it is important to prevent the microchanneling. A series of experiments was conducted to solve this question, in the following sequence (i) to (iii).

Experimental Procedure

An n-Si(100) substrate of 10 Ωcm was used.

| (i) Sample 7.1 ion preimplantation*1 | not effected |
| Sample 7.2 ion preimplantation*1 | Ge+ 40 keV, $1 \times 10^{13}$ cm$^{-2}$ |
| Sample 7.3 ion preimplantation*1 | Ge+ 40 keV, $2 \times 10^{13}$ cm$^{-2}$ |
| Sample 7.4 ion preimplantation*1 | Ge+ 40 keV, $5 \times 10^{13}$ cm$^{-2}$ |
| Sample 7.5 ion preimplantation*1 | Ge+ 40 keV, $2 \times 10^{14}$ cm$^{-2}$ |
| (ii) All samples BF$_2$+ ion implantation | 10 keV, $3 \times 10^{13}$ cm$^{-2}$ |
| (iii) SIMS*2 measurement of the boron distribution along depth | |

(NOTE
*1 ion implantation prior to usual ion implantation of impurity
*2 secondary ion mass spectroscopy)

Figure 7:
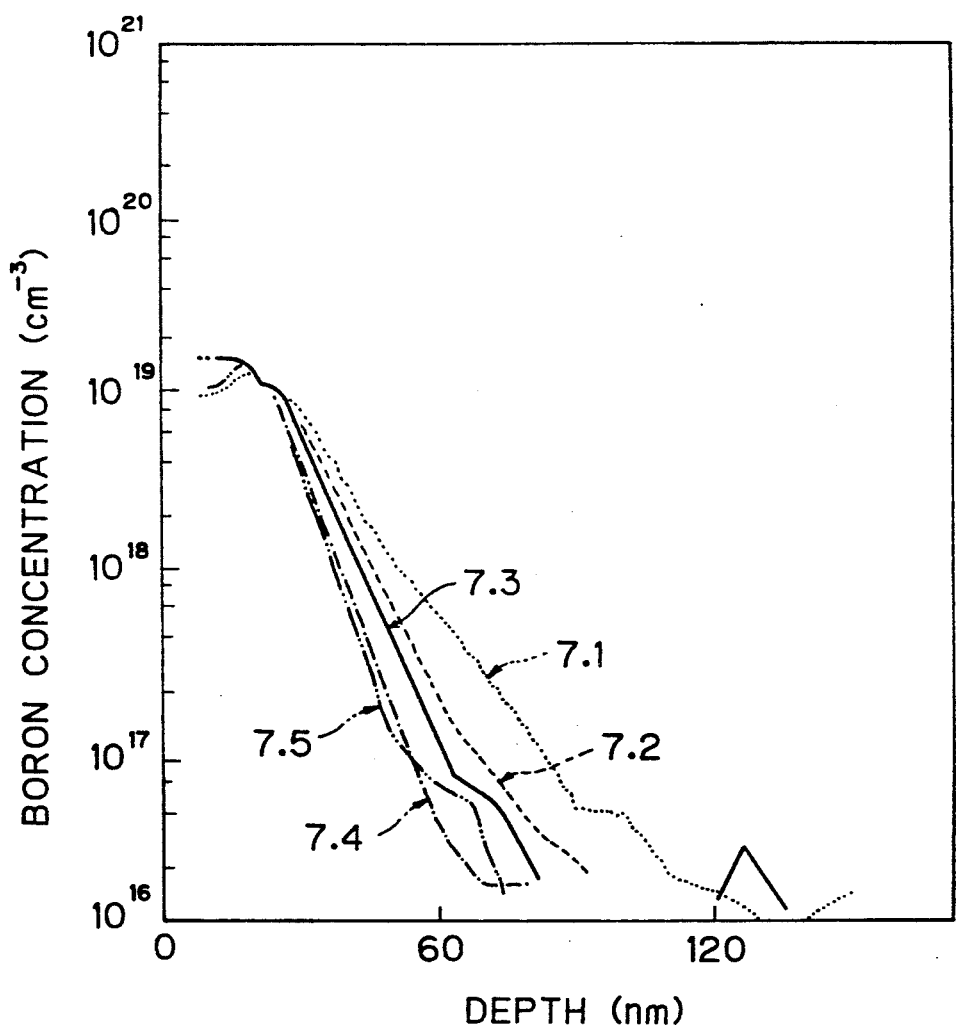
FIG. 7 is a graph showing a boron distribution (SIMS measurement) when a Ge+ ion implantation was carried out and then $BF_2^+$ ions were implanted.

Condition (ii) was selected so that a self amorphization does not occur. Essential results can not be obtained if the BF$_2$+ ion implantation is effected with a high dose, which causes a self amorphization. FIG. 7 shows a boron distribution along a depth obtained by the SIMS measurement. In samples 7.1 to 7.3, a deep distribution of boron is observed due to the microchanneling, but in samples 7.4 and 7.5, the distributions have substantially the same profile. This is evidence that the same effect of preventing microchanneling is obtained by the ion implantation at 40 keV with $5 \times 10^{13}$ cm$^{-2}$ as that obtained by a full amorphization ($\chi = 100\%$).

Figure 8:
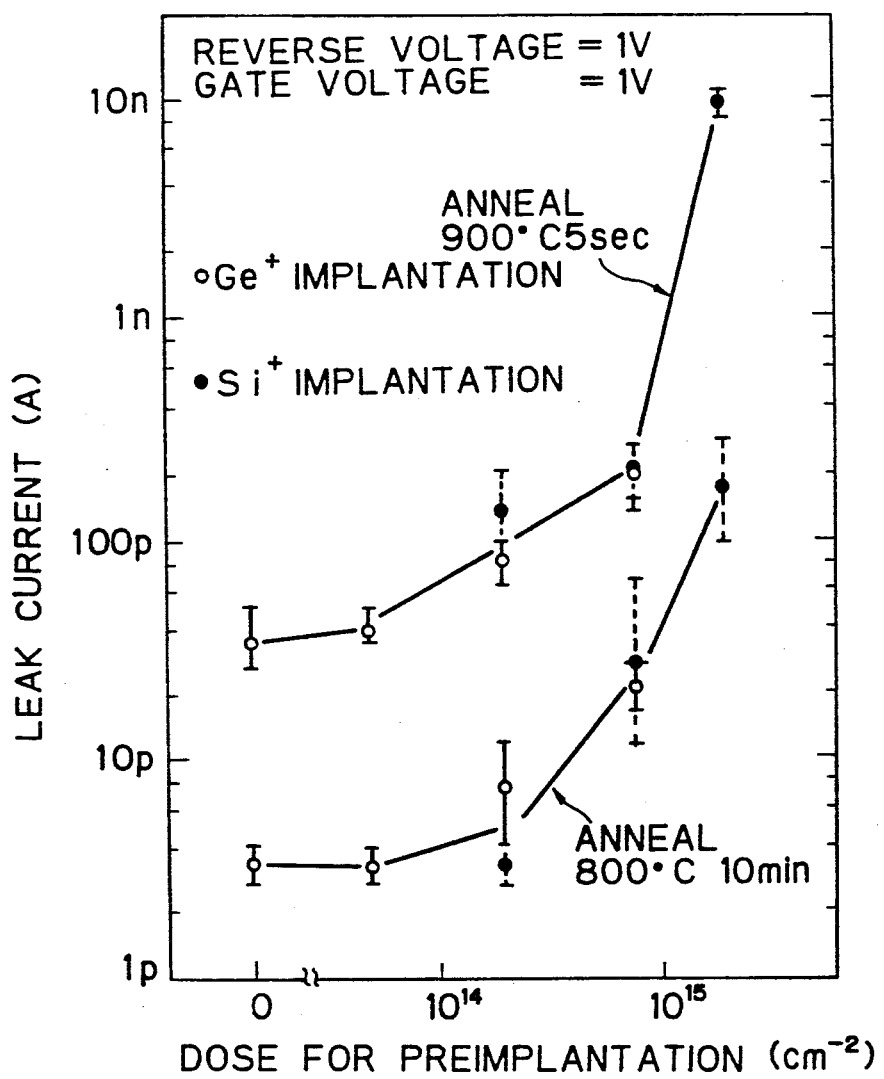
FIG. 8 is a graph showing the variation of the leak current of a gate-controlled type diode as a function of the ion preimplantation condition for the cases in which Ge+ or Si+ ions were preimplanted.

The same effect can be obtained when Si+ ion is used in a smaller dose for the ion preimplantation. FIG. 8 shows the dependency of the leak current on the Ge+ or Si+ dose for preimplantation under varied annealing conditions. The leak current is reduced when the dose is smaller.

The same question as in the case of Ge+ arises, of whether a smaller dose can prevent the microchanneling. A series of experiments was conducted to solve this question, in the following sequence (i) to (iii).

Experimental Procedure

An n-Si(100) substrate of 10 Ωcm was used.

| (i) Sample 9.1 ion preimplantation*1 | not effected |
| Sample 9.2 ion preimplantation*1 | Si+ 40 keV, $5 \times 10^{13}$ cm$^{-2}$ |
| Sample 9.3 ion preimplantation*1 | Si+ 40 keV, $2 \times 10^{14}$ cm$^{-2}$ |
| Sample 9.4 ion preimplantation*1 | Si+ 40 keV, $4 \times 10^{14}$ cm$^{-2}$ |
| Sample 9.5 ion preimplantation*1 | Si+ 40 keV, $8 \times 10^{14}$ cm$^{-2}$ |
| Sample 9.6 ion preimplantation*1 | Si+ 40 keV, $2 \times 10^{15}$ cm$^{-2}$ |
| (ii) All samples BF$_2$+ ion implantation | 15 keV, $3 \times 10^{13}$ cm$^{-2}$ |
| (iii) SIMS measurement of the boron distribution along depth | |

(NOTE
*1 ion implantation prior to usual ion implantation of impurity)

Figure 9:
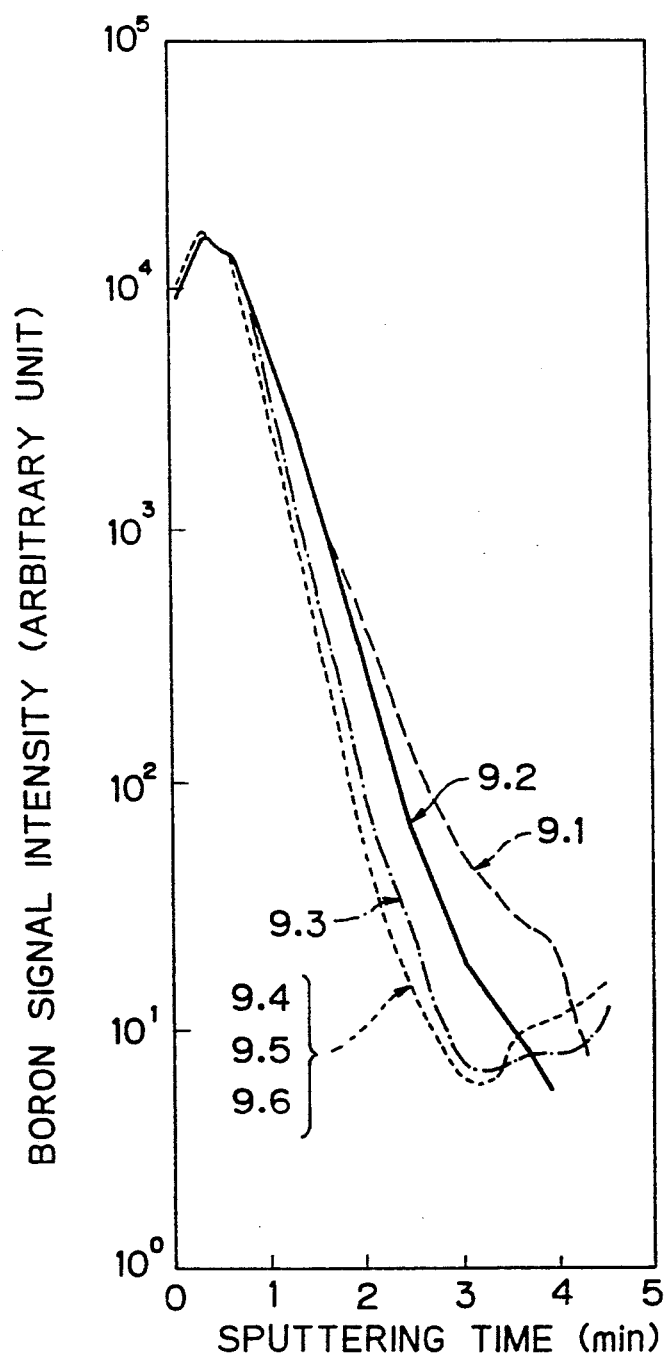
FIG. 9 is a graph showing a boron distribution (SIMS measurement) obtained when Si+ ions were preimplanted and then $BF_2^+$ ions were implanted.

FIG. 9 shows a boron distribution along a depth obtained by the SIMS measurement. The ordinate axis represents the signal intensity for boron, which corresponds to the boron concentration, and the abscissa the spattering time, which corresponds to the depth from the Si substrate. As seen from FIG. 9, sample 9.1 has a deep distribution of boron due to the microchanneling. In sample 9.2, in which the silicon dose was low, the microchanneling was not sufficiently prevented. Nevertheless, in sample 9.3, the microchanneling was suppressed to substantially the same extent as in samples 9.4 to 9.6 implanted with silicon at a high dose. Namely, it is proved that substantially the same effect of preventing the microchanneling is obtained by a smaller Si+ ion dose effected at 40 keV and $2 \times 10^{14}$ cm$^{-2}$ as that obtained by full amorphization ($\chi = 100\%$).

RBS has been used for determine the dose sufficient for amorphization, in which information on the silicon lattice sites is obtained from the channeling behavior of a high energy helium ion to determine whether or not a full amorphization is completed. The foregoing result of sample 1.3 shown in FIG. 1 indicates that a great amount of atoms are positioned on the sites where nuclear scattering occurs even when high energy helium ions are introduced in the channeling direction. Therefore, in sample 1.4, 45.2% of silicon atoms are considered to contribute to the nuclear scattering of the helium ions. Under this condition, i.e., when the BF$_2$+ ion implantation was carried out at 15 keV and $3 \times 10^{13}$ cm$^{-2}$ after the Ge+ ion was implanted at 40 keV and $5 \times 10^{13}$ cm$^2$, it is apparent from FIG. 7 that a microchanneling of the implanted boron ion (B+) does not occur. This means that a disordering of the crystal lattice necessary for preventing the microchanneling of such a low energy B+ ion (about 3 keV in this case) is different from the amorphization required for preventing the channeling of helium ions.

Figure 10:
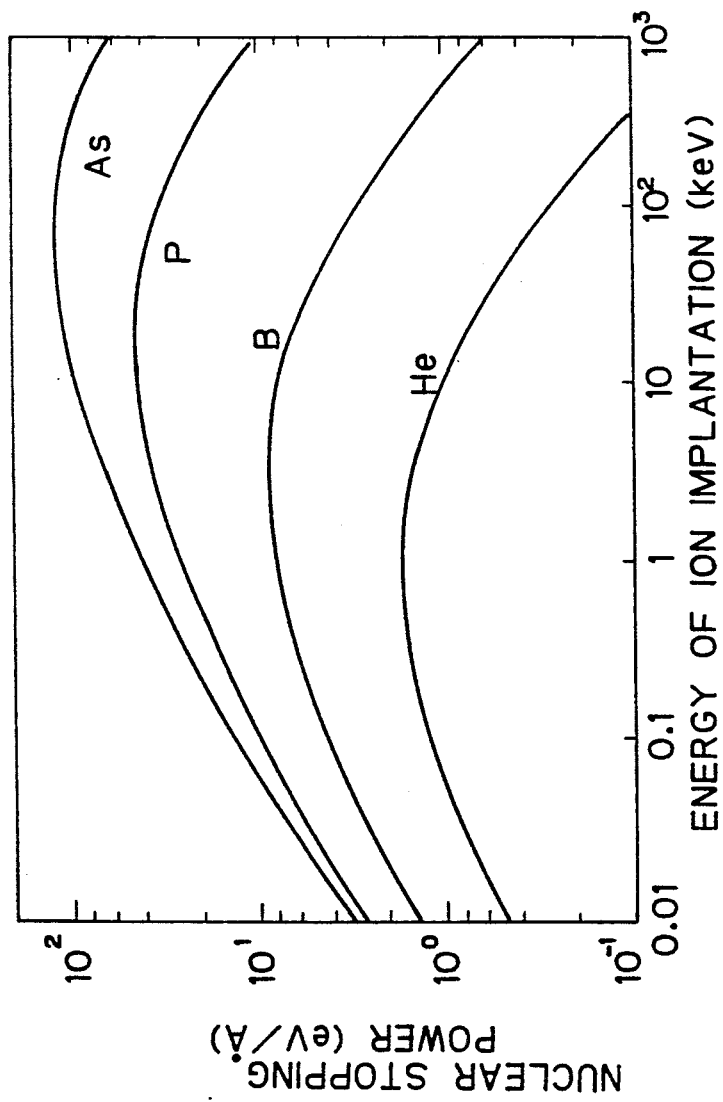
FIG. 10 is a graph showing the nuclear stopping power of various ions in silicon as a function of the ion implantation energy.

This is due to the fact that the probability of scattering of ions by atoms varies in accordance with various parameters such as the ion mass, the ion energy, and the type of target, etc. FIG. 10 shows the nuclear stopping power of helium, boron, phosphorus, or arsenic ions, i.e., the energy lost due to nuclear scattering when the ion moves through a silicon subject over a unit distance. The MeV grade helium ion used in RBS has a nuclear stopping power far different from that of the several keV B+ ion used in BF$_2$+ ion implantation; the latter being greater than the former. The high energy helium ions are difficult to scatter at so large an angle that the channeling is completed, and therefore, more silicon atoms not on the regular crystal lattice sites are required to suppress the channeling of helium ions than are required to suppress the channeling of low energy B+ ions.

The silicon atoms on irregular sites are formed by ion preimplantation. The inventors found that the amount of silicon atoms on irregular sites required to prevent the boron microchanneling in the case of the BF$_2$+ ion implantation, which is defined by the $\chi$ value measured by RBS, is not necessarily 100% as conventionally required. This also applies to ions having a mass heavier than that of boron.

Table 2 shows the silicon ion doses and the corresponding $\chi$ values. The silicon dose by the 40 keV, $2 \times 10^{14}$ cm$^{-2}$ implantation substantially prevents the boron channeling, as seen from FIG. 9. In this case, the $\chi$ value is 32.3% and an ion preimplantation is not required to be effected to an extent such that the $\chi$ value is 100% as in the conventional amorphization.

TABLE 2

| Sample | $\chi$ (%) |
| --- | --- |
| Si+ ion implantation not effected (measurement of channeling) | 1.9 |
| Si+ 40 keV, $2 \times 10^{15}$ cm$^{-2}$ | 100 |
| Si+ 40 keV, $4 \times 10^{14}$ cm$^{-2}$ | 99 |
| Si+ 40 keV, $2 \times 10^{14}$ cm$^{-2}$ | 32.3 |
| Si+ 40 keV, $5 \times 10^{13}$ cm$^{-2}$ | 7.0 |

The microchanneling is suppressed to an extent such that a pn-junction having a low leak current can be formed, by ion preimplantation at a smaller dose as low as about 30% that for amorphization, when determined by an RBS measurement.

Figure 11:
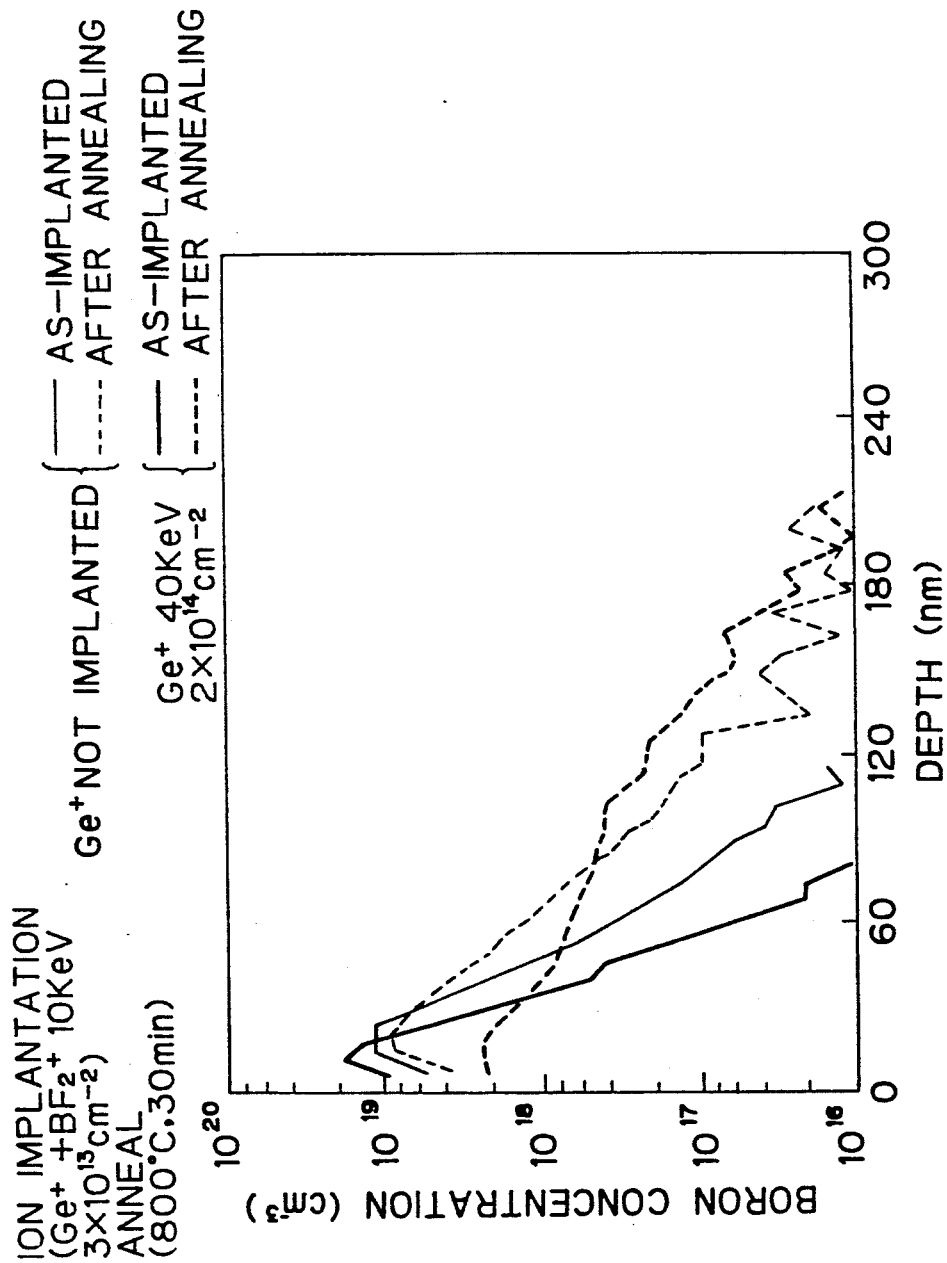
FIG. 11 is a graph showing an abnormal diffusion of boron during annealing at 800° C. when Ge+ ions were preimplanted.

The boron diffusion due to annealing was also studied by SIMS. FIG. 11 shows the boron distributions before and after annealing, in which a Ge+ ion preimplantation at 40 keV and $2 \times 10^{14}$ cm$^{-2}$ was or was not effected and then a BF$_2$+ ion implantation was carried out at 10 keV with $3 \times 10^{13}$ cm$^{-2}$. The solid lines represent the as-implanted distribution; in a thin line for the case in which the Ge+ ion preimplantation was not effected and in a thick line for the case in which the Ge+ ion preimplantation was effected. In the as-implanted conditions, the microchanneling is suppressed and a shallow distribution of boron is obtained when the Ge+ ion preimplantation wa effected. The broken lines represent the boron distributions after annealing at 800° C. for 30 min; in a thin line for the case in which the Ge+ ion preimplantation was not effected and in a thick line for the case in which the Ge+ ion preimplantation was effected. When the Ge+ ion preimplantation was effected, the boron distribution became deep after annealing, though it was shallow in the as-implanted condition. This is considered to be due to an abnormal diffusion caused by the influence of an amorphous layer induced by the Ge+ ion implantation.

A study of such an abnormal diffusion due to the 800° C. heat treatment as shown in FIG. 11 was made.

Figure 12:
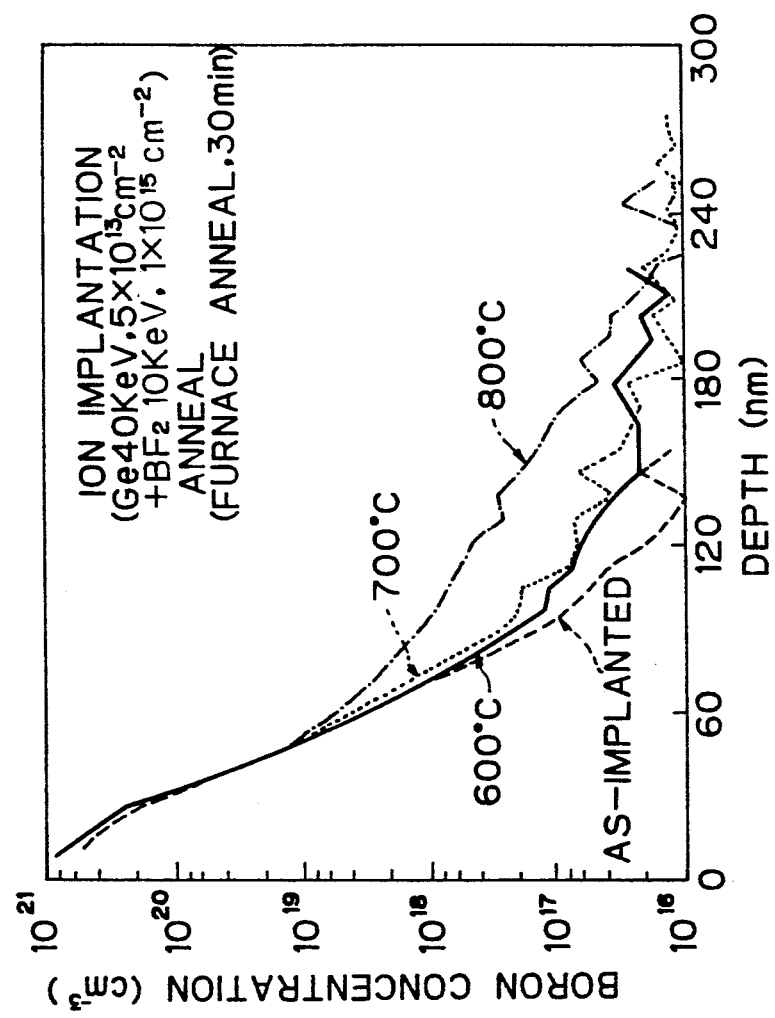
FIG. 12 is a graph showing the annealing temperature dependency of the boron distribution when Ge+ ions were preimplanted.

FIG. 12 shows SIMS measurements of the boron distribution for the case in which a Ge+ ion preimplantation was effected at 40 keV with $5 \times 10^{13}$ cm$^{-2}$ followed by a BF$_2$+ ion implantation at 10 keV with $1 \times 10^{15}$ cm$^{-2}$ and then annealing was carried out at various temperatures of 800°, 700°, and 600° C. When annealing was carried out at 800° C., an abnormal diffusion is observed at a boron concentration of about $10^{18}$ cm$^{-3}$ or lower, though such an abnormal diffusion did not occur when annealing was carried out at 700° or 600° C. This means that the abnormal diffusion due to the 800° C. heat treatment can be suppressed by lowering the annealing temperature.

Figure 13:
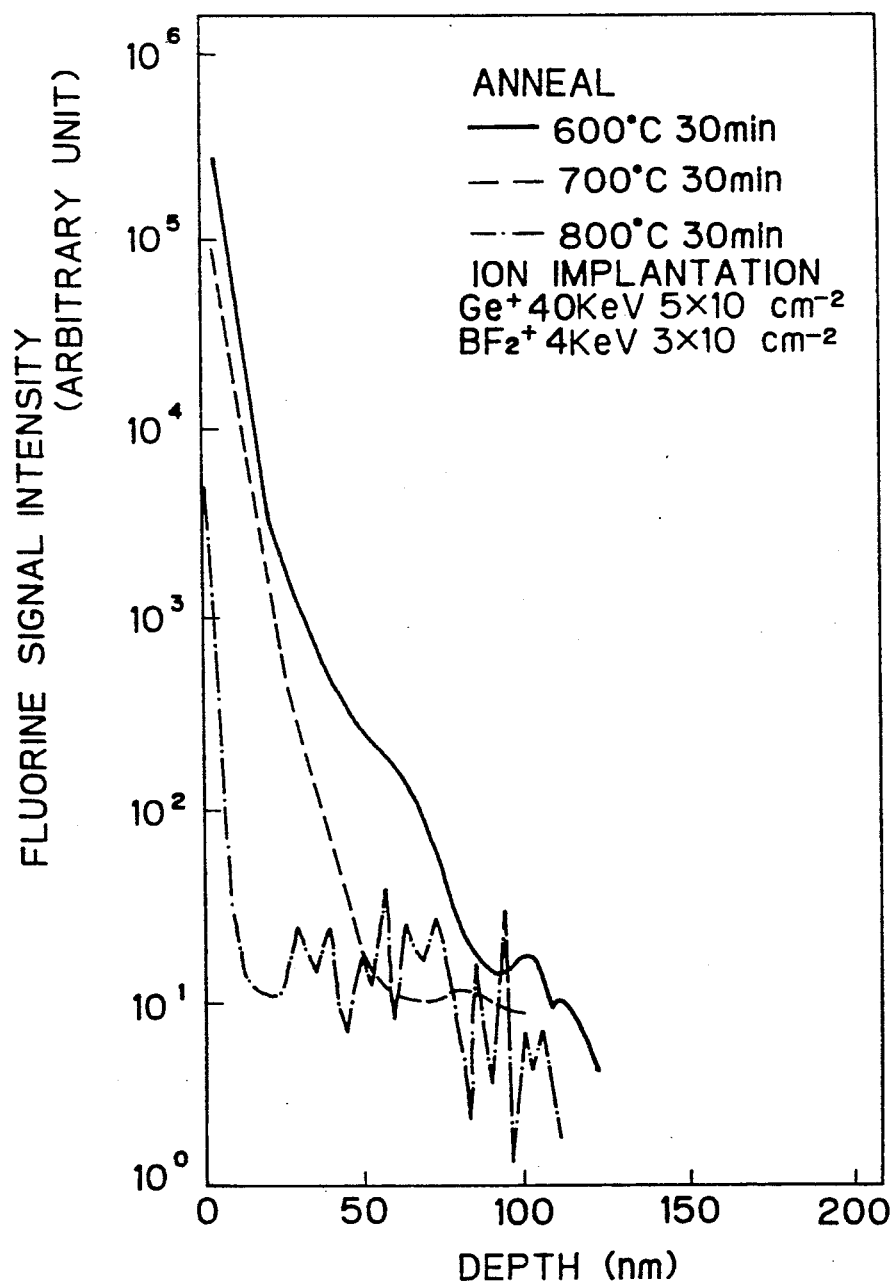
FIG. 13 is a graph showing a local segregation of fluorine when Ge+ ions were preimplanted prior to a $BF_2^+$ ion implantation.

FIG. 13 shows SIMS measurements of the distribution of fluorine for the case in which a Ge ion preimplantation was effected at 40 keV and $5 \times 10^{13}$ cm$^{-2}$ followed by a BF$_2$+ ion implantation at 4 keV and $3 \times 10^{15}$ cm$^{-2}$ and then annealing was carried out at various temperatures of 800°, 700°, and 600° C. As aforedescribed, fluorine is locally concentrated at those regions in which crystal defects are present. As seen from FIG. 13, when annealing was carried out at 600° C., fluorine is distributed over a wide area of the diffused layer to indicate that a great amount of crystal defects is present in the diffused layer, but when annealing was carried out at 700° C., although fluorine is retained at the vicinity of surface, no fluorine is retained at the depth of 100 nm at which the junction is formed. Namely, the crystallinity is recovered in the region of and around the pn-junction which contributes to the leak current. When annealing was carried out at 800° C., fluorine was apparently mostly diffused outward and not locally concentrated so that a good crystallinity was obtained. Nevertheless, the 800° C. annealing causes an abnormal diffusion which leads to a difficulty in the formation of a shallow junction, as already described.

Then, when Ge+ ion is implanted at a dose less than that for a full amorphization, annealing at a temperature lower than 800° C. and higher than 600° C. effectively prevents the abnormal diffusion of boron and provides a good crystallinity.

In the above experiment, a heat treatment for annealing was carried out for 30 min. Generally, the diffusion distance can be expressed as $2(Dt)^{(\frac{1}{2})}$ in which the distance depends on the annealing time merely in the form of a function of $\frac{1}{2}$ power, and is not significantly affected by the time. In contrast, the annealing temperature significantly affect the diffusion distance, because it influences the diffusion coefficient in the form of an exponential function as expressed by $D = D_0 \exp(-E_0/kT)$, where $E_0$ is an activation energy. In FIG. 12, the diffusion distance becomes about two fold greater when the annealing temperature is raised from 700° C. to 800° C. Therefore, it is considered advantageous to use a lower annealing temperature even if a four fold longer annealing time is required. The annealing time also may be reduced to about 10 min in accordance with the temperature controllability of an annealing apparatus to be used.

According to a preferred embodiment of the present invention, a shallow diffused layer free from crystal defects was obtained by a Ge+ ion preimplantation to a silicon semiconductor at 40 keV and $5 \times 10^{13}$ cm$^{-2}$, which is as small as $\frac{1}{4}$ that required in the conventional Ge+ ion preimplantation. This enables the production of a device with a minimized leak current at a reduced cost for ion preimplantation.

According to another preferred embodiment of the present invention, a shallow diffused layer free from crystal defects was obtained by a Si+ ion preimplantation to a silicon semiconductor at 40 keV and $2 \times 10^{14}$ cm$^{-2}$, which is as small as 1/10 that required in the conventional Si+ ion preimplantation. This also enables the production of a device with a minimized leak current at a reduced cost for ion preimplantation.

Annealing at a temperature higher than 600° C. and lower than 800° C. provides a pn-junction in which an abnormal diffusion is suppressed and a good crystallinity is ensured.

In an embodied process of producing a semiconductor device according to the present invention, to form the source/drain region of a PMOS, for example, a Ge+ ion preimplantation is effected at 40 keV and $5 \times 10^{13}$ cm$^{-2}$ prior to a BF$_2$+ ion implantation at 4 keV and $2 \times 10^{15}$ cm$^{-2}$. This provides a MOSFET having a good characteristic in which a short channel effect is reduced in comparison with that of a MOSFET produced without the ion preimplantation. The aforementioned BF$_2$+ implantation condition of 4 keV and $2 \times 10^{15}$ cm$^{-2}$ may be occasionally varied, but the present invention is effective for other ions at different doses and energies, particularly in a low energy range.

In the formation of the base of a bipolar transistor, a Ge+ ion preimplantation at 40 keV and $5 \times 10^{13}$ cm$^{-2}$, when effected prior to a BF$_2$+ ion implantation at 15 keV and $3 \times 10^{13}$ cm$^{-2}$, provided a shallow junction and an improved characteristic.

EXAMPLE 2

According to a further preferred embodiment of the present invention, a disordered layer is formed to a depth greater than a predetermined depth for an implantation of an impurity ion. The formation of a disordered layer having such a depth ensures that the impurity ions are implanted within the disordered layer only, and thereby, effectively prevents an enhanced diffusion of impurities, which occurs particularly in the case of a low temperature, long time annealing.

Generally, the crystal defects in a semiconductor crystal induced by an ion implantation are classified into three types, as follows:

(1) Defect in the surface region of a semiconductor.
(2) Defect at the interface between a amorphous region and a crystalline region.
(3) Defect in a recrystallized region.

Among these defects, the defect at the amorphous region/crystal interface (a/c interface) of (2) is most important. The defect in the semiconductor surface region, when retained, does not significantly affect a pn-junction formed at a position about 100 nm deep from the surface. The formation of the defect in a recrystallized region of (3) can be avoided by using a Ge+ ion implantation or a Si+ ion implantation at a low dose.

A high temperature and/or long time annealing after an impurity ion implantation can reduce the defect amount but causes a diffusion of impurities, which is disadvantageous for the formation of a shallow diffused layer.

It is known that, when a low temperature and long time annealing is carried out, for example, a great amount of vacancies is present in a recrystallized region and prevents the formation of silicon atoms on irregular sites, but in the region below the recrystallized region, a great amount of silicon atoms on irregular sites is formed to induce an enhanced diffusion of impurities such as boron. The enhanced diffusion is also disadvantageous to the formation of a shallow diffused layer and is preferably prevented as much as possible.

To prevent the enhanced diffusion, it is conventionally proposed that an impurity ion is implanted so as to stay within an amorphized region. In this method, however, the aforementioned defect at an a/c interface of type (2) is necessarily retained at the vicinity of a pn-junction, to cause a leak current, and a good junction layer essentially can not be formed.

To reduce the leak current, it is effective to reduce the dose of preimplantation to an extent such that the defect retained at the a/c interface is mitigated. In a disordered region induced by such a low dose, however, silicon atoms on irregular sites are formed after annealing to cause an enhanced diffusion of impurities.

Even at a reduced dose, silicon atoms on irregular sites are still formed and cause an enhanced diffusion, which makes it impossible to form a shallow junction.

Silicon atoms on irregular sites are formed at deeper sites than the region damaged by the preimplantation, to thereby cause the enhanced diffusion.

This means that mere a control of the dose of ion preimplantation is insufficient to substantially eliminate the defect at the disordered region/crystal interface and prevent the enhanced diffusion so that a shallow diffused layer is formed.

This problem in a low temperature and long time annealing is solved by effecting an ion preimplantation so that a disordered region has a depth greater than that of a predetermined depth of impurity ion implantation. This ensures that an impurity ion irradiation to the disordered region is effected so that the impurity ion is introduced into the disordered region only.

The ion preimplantation condition for forming a disordered region having such a depth is determined by a preliminary experiment in a sequence such as the following:

Experimental Procedure

An n-Si(100) substrate of 10 Ωcm was used.

| | | |
|---|---|---|
| (i) Sample 1 ion preimplantation | | Si+ 40 keV, $4.0 \times 10^{14}$ cm$^{-2}$ |
| Sample 2 ion preimplantation | | Si+ 40 keV, $3.3 \times 10^{14}$ cm$^{-2}$ |
| Sample 3 ion preimplantation | | Si+ 40 keV, $3.0 \times 10^{14}$ cm$^{-2}$ |
| Sample 4 ion preimplantation | | Si+ 40 keV, $2.3 \times 10^{14}$ cm$^{-2}$ |
| (ii) All samples impurity ion implantation BF$_2$+ | | 10 keV, $3 \times 10^{13}$ cm$^{-2}$ |
| (iii) Annealing at 800° C., 30 min in nitrogen atmosphere | | |
| (iv) SIMS measurement of the boron distribution along depth | | |

Figure 14:
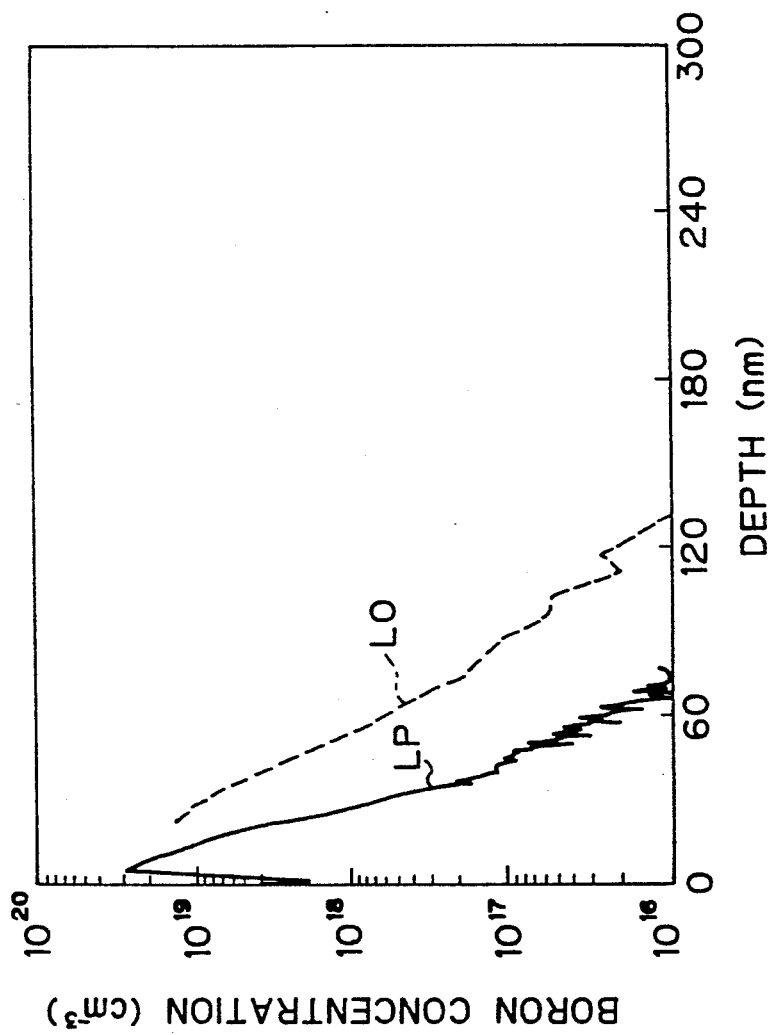
FIG. 14 is a graph showing an as-implanted boron distribution along a depth for cases in which a preimplantation was effected and in which a preimplantation was not effected.

FIG. 14 shows the as-implanted boron distribution along the depth before annealing. Samples 1 to 4 exhibited substantially the same distribution of boron as represented by the single curve LP. For comparison, the curve L0 shows another as-implanted boron distribution along a depth obtained when the preimplantation of Si+ ion was not carried out but the BF$_2$+ ion implantation was simply carried out. The as-implanted depth amounted to about 100 nm when the preimplantation was not effected and was suppressed to about 50 nm or half of the former value, which shows that the microchanneling was prevented for every condition of the preimplantation.

Figure 15:
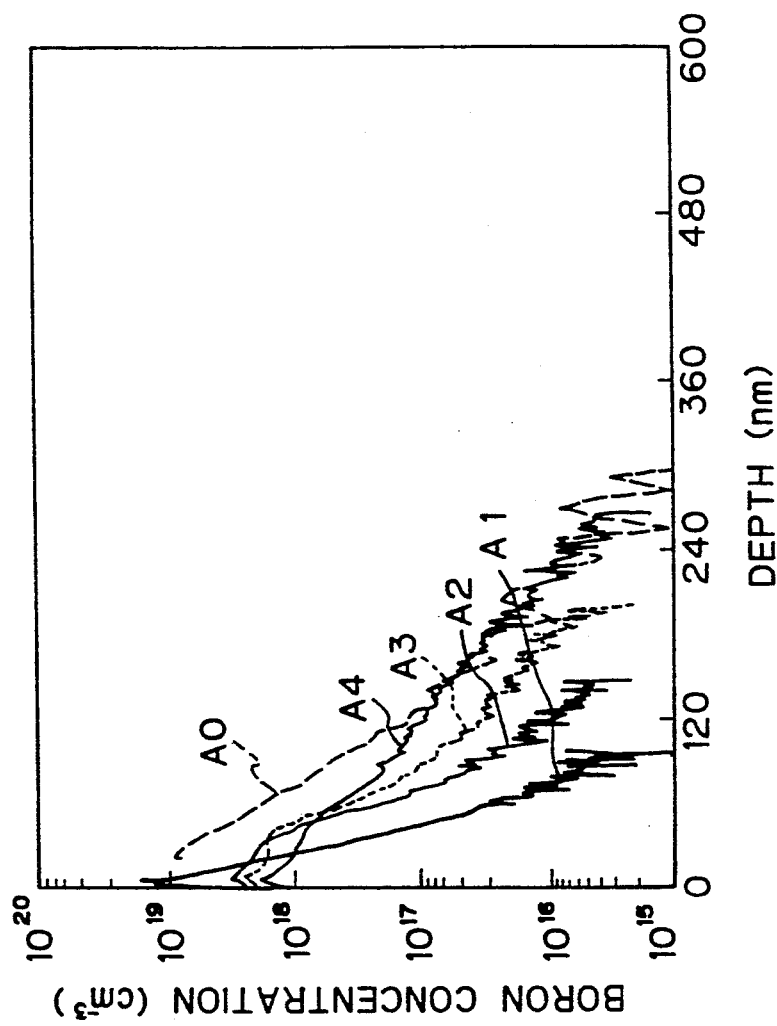
FIG. 15 is a graph showing a boron distribution after annealing in which the ion preimplantation dose was varied.

FIG. 15 shows the boron distribution along a depth after annealing. The curve A0 corresponds to the above-mentioned comparative sample, which was not subjected to the ion preimplantation prior to the $BF_2{}^+$ ion implantation, and the curves A1 to A4 correspond to samples 1 to 4, respectively. The enhanced diffusion is not substantially prevented by a preimplantation dose such as used in sample 4 ($2.3 \times cm^{-2}$). The enhanced diffusion is evidently prevented when the ion preimplantation is effected at a dose comparable to or more than that used in sample 3 ($3.0 \times cm^{-2}$). An ion preimplantation at this dose enables an impurity diffused layer having a substantial depth of about 200 nm or less to be formed.

Figure 16:
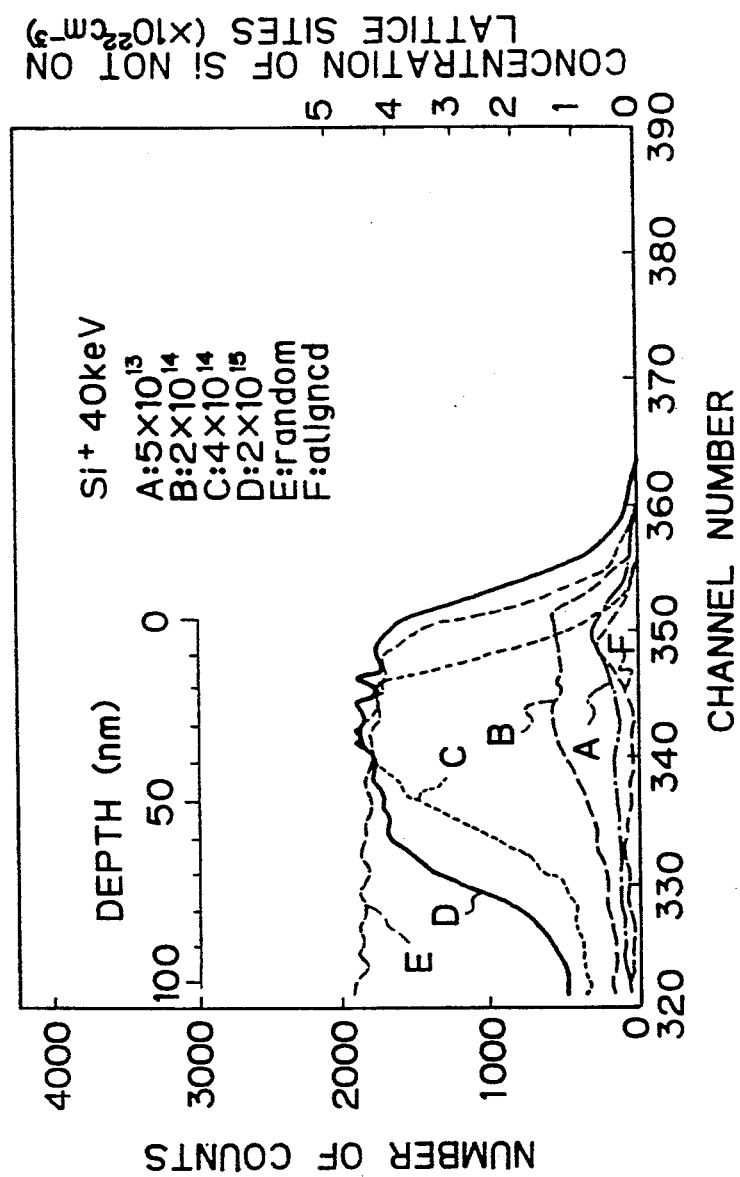
FIG. 16 is a graph showing the depth of a disordered region of a silicon crystal in which an ion preimplantation was effected at various doses.

It is known that the dose in $Si^+$ ion preimplantation and the obtained depth of disordered region have a relationship as shown in FIG. 16, as reported in M. Kase et al., Appl. Phys. Lett., 56(13) 1231(1990). It is seen from FIG. 16 that the disordered region depth for an $Si^+$ ion implantation energy of 40 keV is about 35 nm for a dose of $2 \times 10^{14}$ cm$^{-2}$ (condition B) and about 50 nm for a dose of $4 \times 10^{14}$ cm$^{-2}$ (condition C).

It is understood from the comparison between the results of FIGS. 15 and 16 that the substantial boron implanted depth falls within the disordered region under the ion preimplantation conditions of samples 1, 2, and 3.

Figure 17:
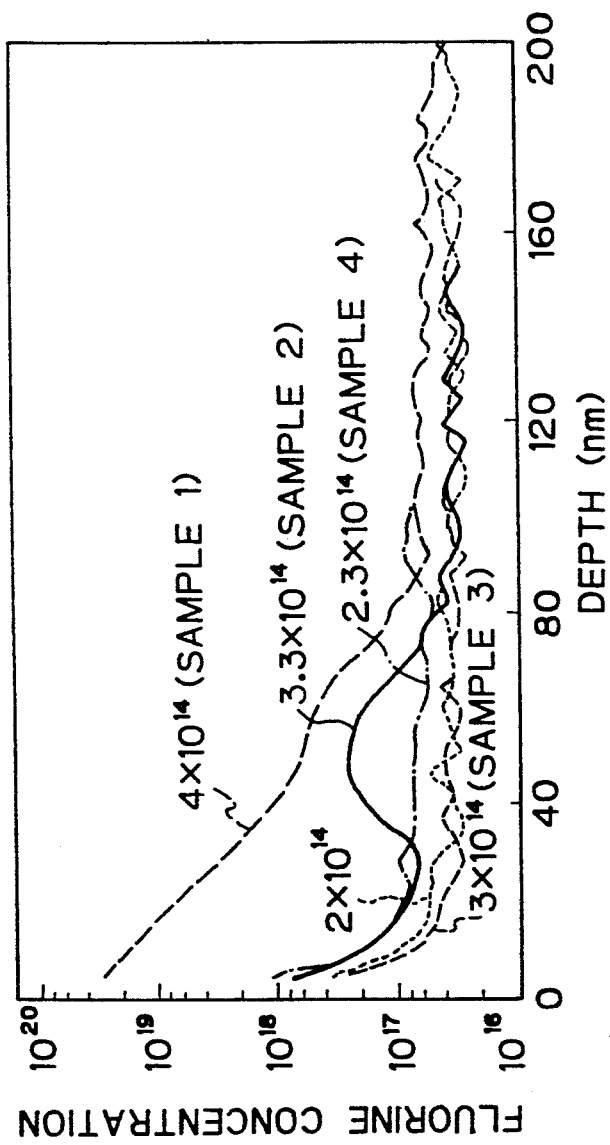
FIG. 17 is a graph showing a fluorine distribution along a depth after annealing in which the ion preimplantation dose was varied.

The condition of ion preimplantation also should be determined, taking into consideration the degree of the defects retained after annealing. The retained defects can be estimated by the fluorine distribution, as already described. FIG. 17 shows a fluorine distribution after annealing at 800° C. for 30 min at various doses of the $Si^+$ ion preimplantation, in which five levels of doses are covered including those for samples 1 to 4.

In sample 1, at a dose of $4 \times cm^{-2}$, a great amount of defects is observed.

The defect amount is remarkably reduced and defects are retained only at the disordered region/crystal interface, when the dose is reduced to that of sample 2 ($3.3 \times cm^{-2}$). This disordered region/crystal interface is positioned at a depth of about 50 nm, which is distant from the depth of 100 nm at which a pn-junction is to be formed, and a good junction free from leak current can be formed.

In sample 3 in which the dose is further reduced to $3.0 \times cm^{-2}$, substantially no defects are observed and a good crystallinity is obtained. This means that, under this annealing condition, the retained defects are completely eliminated by reducing the dose in $Si^+$ ion preimplantation to $3.0 \times cm^{-2}$ or less. Considering a probable improvement expected when varying the annealing condition, the ion preimplantation conditions or doses of samples 2 and 3 can be adopted as allowable, from the viewpoint of the retained defects.

In stricter sense, the degree of disorder in a disordered region increases from the surface to a certain depth and decreases in a deeper range. The degrees of disorder ($\chi$%) obtained in the above-experiment are summarized in Table 3.

TABLE 3

| Sample No. | Preimplantation condition | $\chi$ (%) |
|---|---|---|
|  | not preimplanted (channeling measurement) | 1.9 |
| 1 | $Si^+$ 40 keV, $4.0 \times 10^{14}$ cm$^{-2}$ | 40–99 |
| 2 | $Si^+$ 40 keV, $3.3 \times 10^{14}$ cm$^{-2}$ | 30–50 |
| 3 | $Si^+$ 40 keV, $3.0 \times 10^{14}$ cm$^{-2}$ | 30–40 |

TABLE 3-continued

| Sample No. | Preimplantation condition | $\chi$ (%) |
|---|---|---|
| 4 | $Si^+$ 40 keV, $2.3 \times 10^{14}$ cm$^{-2}$ | 20–25 |

The degree of disorder in samples 2 and 3 ranges from 30 to 50%. The enhanced diffusion during a low temperature and long time annealing is effectively suppressed by forming a disordered region having a degree of disorder substantially within this range.

In Table 3, the $\chi$ values are expressed as a numerical range, because the data unavoidably included the distribution along a depth as mentioned before, an annealing effect of an ion beam for implantation, and run-to-run fluctuations including the implantation temperature, etc.

The principle of this embodiment has an advantage in that the shallower the diffused layer, the higher the effect. Namely, when a shallower implantation of impurity such as boron is to be carried out to form a shallower diffused layer, a disordered region which will sufficiently cover such a shallower depth of impurity implantation can be formed by an ion preimplantation at a small dose such that no defects are retained after annealing, and thereby, the enhanced diffusion is more easily suppressed.

The ion preimplantation for forming a disordered region can be essentially effected by an ion irradiation at a low dose.

The ions for preimplantation according to the present invention are not necessarily limited to silicon ion and germanium ion, but may be those ions which are not electrically activated in a semiconductor substrate, such as fluorine ions, carbon ions, etc.

In a process for producing a semiconductor device according to an embodiment of the present invention, to form the source/drain region of a PMOS, for example, a $Ge^+$ ion preimplantation is effected at 40 keV and $5 \times 10^{13}$ cm$^{-2}$ prior to a $BF_2{}^+$ ion implantation at 4 keV and $2 \times 10^{13}$ cm$^{-2}$. This provides a MOSFET having a good characteristic in which a short channel effect is reduced in comparison with that of a MOSFET produced without the ion preimplantation. The aforementioned $BF_2{}^+$ implantation condition of 4 keV and $2 \times 10^{15}$ cm$^{-2}$ may be occasionally varied, but the present invention is effective for other ions at different doses and energies, particularly in a low energy range.

As herein described, the present invention provides a process for producing a semiconductor device having a shallow diffused layer, by preventing a retaining of the crystal defects induced by ion implantation and suppressing the microchanneling.

A preferred embodiment of the present invention more advantageously prevents the retaining of crystal defects by forming a disordered region having a depth greater than that of a predetermined implantation of impurity, and thus, prevents an enhanced diffusion during a low temperature and long time annealing.

We claim:

1. A process for producing a semiconductor device, in which a first conductivity type dopant is implanted into a semiconductor substrate, said process comprising the steps of:

prior to said implantation of the first conductivity type dopant, implanting a second conductivity type dopant into the semiconductor substrate having a crystalline structure to form a disordered region having a degree of disorder such that microchanneling of the later implanted fist conductivity type dopant does not substantially occur and that said disordered region includes a plurality of amorphous regions interspersed with crystalline regions on a common plane defined substantially parallel between upper and lower boundary surfaces of the disordered region and implanting said first conductivity type dopant into said disordered region.

2. A process according to claim 1, wherein said second conductivity type dopant is electrically inactive.

3. A process according to claim 1, wherein said disordered region is formed such that the disordered region has a depth greater than that to which said first conductivity type dopant is to be implanted.

4. A process according to claim 1, wherein said degree of disorder is such that said disordered region contains the constituent elements of the semiconductor, which are not on the regular lattice sites of the crystalline structure, in a concentration of more than 17% and less than 100%.

5. A process according to claim 4, wherein said concentration is 30 to 50%.

6. A process according to claim 1, wherein a silicon semiconductor substrate is used as said semiconductor substrate.

7. A process according to claim 6, wherein said first conductivity type dopant is selected from the group consisting of phosphorus ions, arsenic ions, boron ions, antimony ions, and ions containing any of these elements.

8. A process according to claim 7, wherein said first conductivity type dopant is boron ions or ions containing boron.

9. A process according to claim 6, wherein said implantation of said second conductivity type dopant prior to said implantation of said first conductivity type dopant is effected by an implantation of germanium ions at a dose of more than $2 \times 10^{13}$ cm$^{-2}$.

10. A process according to claim 9, wherein, after said implantation of germanium ions is completed, implantation of BF$_2{}^+$ ions is carried out at an energy of 15 keV or less or an implantation of boron ions is carried out at an energy of 3 keV or less.

11. A process according to claim 6, wherein said implantation of said second conductivity type dopant prior to said implantation of said first conductivity type dopant is effected by implantation of silicon ions at a dose of more than $5 \times 10^{13}$ cm$^{-2}$.

12. A process according to claim 11, wherein, after said implantation of silicon ions is completed, an implantation of BF$_2{}^+$ ions is carried out at an energy of 15 keV or less or an implantation of boron ions is carried out at an energy of 3 keV or less.

13. A process according to claim 1, wherein, after said implantation of said first conductivity type dopant is completed, the semiconductor substrate is heat-treated at a temperature of lower than 800° C.

14. A process according to claim 13, wherein the temperature of said heat treatment is higher than 600° C.

15. A process according to claim 13, wherein said heat treatment is carried out for a time of from 10 min to 2 hours.

16. A process for producing a semiconductor device, comprising the steps of:
prior to implantation of a predetermined impurity ion, forming in a semiconductor substrate having a crystalline structure a disordered region containing constituent elements of the semiconductor, which are not on the regular lattice sites of the crystalline structure, in a concentration such that microchanneling of the later implanted impurity does not substantially occur and that the disordered region includes a plurality of amorphous regions interspersed with crystalline regions on a common plane defined substantially parallel between upper and lower boundary surfaces of the disordered region, and implanting said impurity ion into said disordered region.

17. A process according to claim 16, wherein said disordered region is formed so that the disordered region has a depth greater than that to which said impurity ion is to be implanted.

18. A process according to claim 16, wherein said concentration of the constituent elements of the semiconductor, which are not on the regular lattice sites of the crystalline structure, is more than 17% and less than 100%.

19. A process according to claim 18, wherein said concentration is 30 to 50%.

20. A process according to claim 16, wherein a silicon semiconductor substrate is used as said semiconductor substrate.

21. A process according to claim 20, wherein said impurity ion is selected from the group consisting of phosphorus ion, arsenic ion, boron ion, antimony ion, and ions containing any of these elements.

22. A process according to claim 21, wherein said impurity ion is boron ion or an ion containing boron.

23. A process according to claim 20, wherein said ion implantation prior to said implantation of a predetermined impurity ion is effected by implantation of germanium ion at a dose of more than $2 \times 10^{13}$ cm$^{-2}$.

24. A process according to claim 23, wherein, after said implantation of germanium ion is completed, an implantation of BF$_2{}^+$ ion is carried out at an energy of 15 keV or less or an implantation of boron ion is carried out at an energy of 3 keV or less.

25. A process according to claim 20, wherein said ion implantation prior to said implantation of a predetermined impurity ion is effected by an implantation of silicon ions at a dose of more than $5 \times 10^{13}$ cm$^{-2}$.

26. A process according to claim 25, wherein, after said implantation of silicon ion is completed, an implantation of BF$_2{}^+$ ions is carried out at an energy of 15 keV or less or an implantation of boron ions is carried out at an energy of 3 keV or less.

27. A process according to claim 16, wherein, after said implantation of an impurity ion is completed, the semiconductor substrate is heat-treated at a temperature of lower than 800° C.

28. A process according to claim 27, wherein the temperature of said heat treatment is higher than 600° C.

29. A process according to claim 27, wherein said heat treatment is carried out for a time of from 10 min to 2 hours.

* * * * *